(12) United States Patent
Ryu et al.

(10) Patent No.: US 11,189,333 B2
(45) Date of Patent: Nov. 30, 2021

(54) COMPENSATING CIRCUIT FOR COMPENSATING CLOCK SIGNAL AND MEMORY DEVICE INCLUDING THE SAME

(71) Applicant: Samsung Electronics Co., Ltd., Suwon-si (KR)

(72) Inventors: Jang-Woo Ryu, Seoul (KR); Soojung Rho, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/939,028

(22) Filed: Jul. 26, 2020

(65) Prior Publication Data

US 2021/0183427 A1 Jun. 17, 2021

(30) Foreign Application Priority Data

Dec. 11, 2019 (KR) .................. 10-2019-0164400

(51) Int. Cl.
| | |
|---|---|
| *G11C 5/14* | (2006.01) |
| *G11C 11/4074* | (2006.01) |
| *G11C 11/4076* | (2006.01) |
| *H03L 7/081* | (2006.01) |
| *G11C 7/06* | (2006.01) |
| *G11C 5/02* | (2006.01) |

(52) U.S. Cl.
CPC .......... *G11C 11/4074* (2013.01); *G11C 5/025* (2013.01); *G11C 5/14* (2013.01); *G11C 7/065* (2013.01); *G11C 11/4076* (2013.01); *H03L 7/0818* (2013.01)

(58) Field of Classification Search
CPC ....... G11C 7/222; G11C 7/227; G11C 7/1093; G11C 11/4074; G11C 11/4076; G11C 5/025; G11C 5/14
See application file for complete search history.

(56) References Cited

U.S. PATENT DOCUMENTS

| | | |
|---|---|---|
| 5,428,321 A | 6/1995 | Yoshida et al. |
| 6,466,063 B2 | 10/2002 | Chen |
| 8,248,130 B2 | 8/2012 | Jain et al. |
| 8,564,354 B2 | 10/2013 | Hamdan |
| 8,643,420 B2 | 2/2014 | Kim et al. |

(Continued)

FOREIGN PATENT DOCUMENTS

KR  1020180026957 A  3/2018

*Primary Examiner* — Toan K Le
(74) *Attorney, Agent, or Firm* — Muir Patent Law, PLLC

(57) ABSTRACT

A memory device includes a delay locked loop (DLL), a clock compensating circuit, and a data input/output (I/O) circuit. The DLL outputs a first clock signal and a second clock signal. The clock compensating circuit adjusts a voltage level of an output node and generates an inner clock signal based on the voltage level of the output node. The data I/O circuit outputs data to an outside based on the inner clock signal. The clock compensating circuit includes first and second pulse adjusting circuits. The first pulse adjusting circuit connected to a first output node and outputs a first adjusting current based on the first clock signal and a voltage level of the first output node. The second pulse adjusting circuit connected to a second output node and outputs a second adjusting current based on the second clock signal and a voltage level of the second output node.

20 Claims, 15 Drawing Sheets

(56) References Cited

U.S. PATENT DOCUMENTS

| | | | |
|---|---|---|---|
| 8,994,421 B1* | 3/2015 | Lee | H03L 7/10 |
| | | | 327/158 |
| 9,559,669 B1 | 1/2017 | Gaide | |
| 9,584,121 B2 | 2/2017 | Ye et al. | |
| 9,966,934 B2 | 5/2018 | Choi et al. | |
| 2013/0214833 A1* | 8/2013 | Kim | G11C 7/1066 |
| | | | 327/156 |
| 2014/0055183 A1* | 2/2014 | Jung | H03L 7/0816 |
| | | | 327/158 |
| 2014/0098622 A1* | 4/2014 | Ware | G11C 7/222 |
| | | | 365/193 |
| 2018/0069532 A1 | 3/2018 | Choi et al. | |
| 2018/0358061 A1* | 12/2018 | Choi | G11C 7/12 |
| 2019/0181869 A1* | 6/2019 | Jung | H03L 7/0814 |
| 2020/0401180 A1* | 12/2020 | Park | G06F 1/06 |

\* cited by examiner

COMPENSATING CIRCUIT FOR COMPENSATING CLOCK SIGNAL AND MEMORY DEVICE INCLUDING THE SAME

CROSS-REFERENCE TO RELATED APPLICATIONS

This application claims priority under 35 U.S.C. § 119 to Korean Patent Application No. 10-2019-0164400 filed on Dec. 11, 2019, in the Korean Intellectual Property Office, the disclosures of which are incorporated by reference herein in their entireties.

BACKGROUND

Embodiments of the inventive concept described herein relate to a compensating circuit, and more particularly, relate to a compensating circuit for compensating a clock signal and a memory device including the same.

Semiconductor memory devices may be classified as volatile memory devices or nonvolatile memory devices. The volatile memory device refers to a memory device that loses data stored therein when a power is turned off. As the volatile memory device, a dynamic random access memory (DRAM) is being used in various devices such as a mobile system, a server, and a graphics device.

Memory devices may operate in synchronization with a clock applied from an outside of the memory devices. The memory device may include a delay locked loop (DLL). The DLL may delay the clock applied from the outside and may generate an inner clock that is used in the memory device. Based on the inner clock, the memory device may control components in the memory device or may transmit data to a memory controller.

A clock generation circuit of the memory device may generate a clock pulse signal based on the inner clock having a cycle that is set by a user or the memory controller. However, in the case where the clock pulse signal is not output from the clock generation circuit due to a process, voltage, and a temperature (PVT) variation, the memory device may fail to transmit data to the memory controller, or data transmission may be delayed.

SUMMARY

Embodiments of the inventive concept provide a compensating circuit for compensating an inner clock signal.

According to an exemplary embodiment, a clock compensating circuit may include a first switching circuit, a first pulse adjusting circuit, a second switching circuit, and a second pulse adjusting circuit. The first switching circuit may determine whether to electrically connect a first node to a second node, based on a first clock signal. The first pulse adjusting circuit connected to a first output node and may output a first adjusting current based on a voltage level of the first output node when the second node is electrically disconnected from the first node and may block the first adjusting current in response to the first clock signal. The second switching circuit may determine whether to electrically connect a third node to a fourth node, based on a second clock signal different from the first clock signal. The second pulse adjusting circuit may output a second adjusting current based on a voltage level of the second output node when the fourth node is electrically disconnected from the third node and may block the second adjusting current in response to the second clock signal. The first pulse adjusting circuit and the second pulse adjusting circuit may feed back a voltage of the first output node and a voltage of the second output node and may adjust a voltage level of the second node and a voltage level of the fourth node.

According to an exemplary embodiment, a memory device may include a delay locked loop (DLL), a clock compensating circuit, and a data input/output (I/O) circuit. The DLL may output a first clock signal and a second clock signal different from the first clock signal. The clock compensating circuit connected to an output node and may adjust a voltage level of the output node based on the first clock signal and the second clock signal and may generate an inner clock signal based on the voltage level of the output node. The data I/O circuit may output data to an outside of the memory device based on the inner clock signal. The clock compensating circuit may include a first pulse adjusting circuit and a second pulse adjusting circuit. The first pulse adjusting circuit connected to a first output node and may determine whether to output a first adjusting current based on the first clock signal and a voltage level of the first output node. The second pulse adjusting circuit connected to a second output node and may determine whether to output a second adjusting current based on the second clock signal and a voltage level of the second output node.

According to an exemplary embodiment, a clock compensating circuit may include a first switching circuit, a first pulse adjusting circuit, a second switching circuit, and a second pulse adjusting circuit. The first switching circuit may determine whether to electrically connect a first node to a second node, based on a first clock signal. The first pulse adjusting circuit may output a first adjusting current based on a voltage level of the first clock signal and a voltage level of the second node to adjust a voltage level of a first output node and may feed back a voltage of the first output node to adjust the voltage level of the second node when the first node is electrically disconnected from the second node. The second switching circuit may determine whether to electrically connect a third node to a fourth node, based on a second clock signal different from the first clock signal. The second pulse adjusting circuit may output a second adjusting current based on a voltage level of the second clock signal and a voltage level of the fourth node to adjust a voltage level of a second output node and may feed back a voltage of the second output node to adjust the voltage level of the fourth node when the third node is electrically disconnected from the fourth node.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Below, embodiments of the inventive concept may be described in detail and clearly to such an extent that an ordinary one in the art easily implements the inventive concept.

Figure 1:
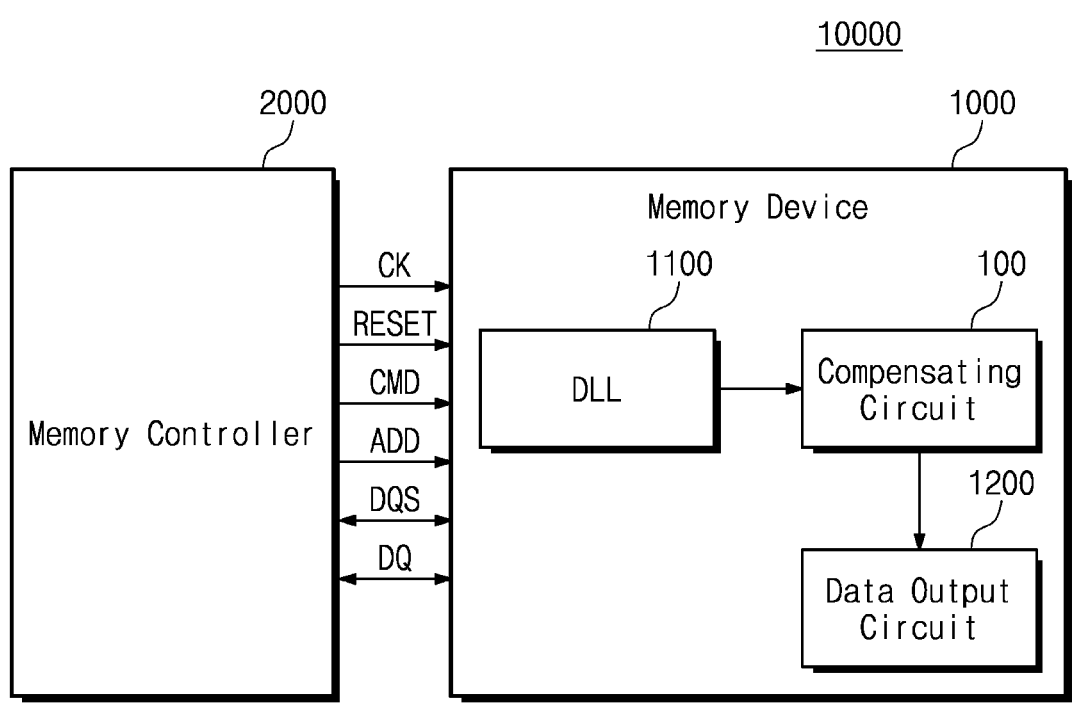
FIG. 1 is a block diagram of a semiconductor device according to an embodiment of the inventive concept.

FIG. 1 is a block diagram of a semiconductor device according to an embodiment of the inventive concept. Referring to FIG. 1, a semiconductor device 10000 may include a memory device 1000 and a memory controller 2000. The semiconductor device 10000 may be a memory system.

The memory device 1000 may receive a clock signal CK, a reset signal RESET, a command CMD, an address ADD, a data strobe signal DQS, and a data signal DQ from the memory controller 2000. The memory device 1000 may operate in synchronization with the clock signal CK. In an embodiment, the memory device 1000 may be a dynamic random access memory (DRAM). However, the inventive concept may not be limited thereto. For example, the memory device 1000 may include a volatile memory, such as a static RAM (SRAM) or a synchronous DRAM (SDRAM), or a nonvolatile memory, such as a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), or a ferroelectric RAM (FRAM).

Examples of the memory system illustrated in FIG. 1 may include a data storage medium based on a flash memory, such as a memory card, a USB memory, and an SSD (Solid State Drive), but are not limited to these examples.

In some examples, the memory controller 2000 may be connected to a host (not shown) and the memory device 1000. The memory controller 2000 may be configured to access the memory device 1000 in response to a request from the host. The memory controller 2000 may be configured to provide an interface between the memory device 1000 and the host.

After the power of the semiconductor device 10000 is turned on, the memory controller 2000 may transmit the reset signal RESET to the memory device 1000. The memory device 1000 may receive the reset signal RERST to perform a reset operation. The memory device 1000 may perform an initialization operation depending on the reset operation. Alternatively, the memory device 1000 may receive a separate initialization command together with the reset signal RERST to perform the initialization operation.

The memory device 1000 may perform an operation corresponding to the command CMD. In an embodiment, the command CMD may include an activate command ACT, a read command RD, and a write command WR. The memory device 1000 may perform a read operation and a write operation, based on the address ADD.

The memory device 1000 may output a data strobe signal DQS and a data signal DQ. The memory device 1000 may output the data strobe signal DQS and the data signal DQ, based on the clock signal CK and the command CMD. For example, in the case of receiving a read command, the memory device 1000 may delay the clock signal CK and may generate the data strobe signal DQS. The memory device 1000 may transmit the data signal DQ including read data to the memory controller 2000 together with the data strobe signal DQS.

The memory device 1000 may include a delay locked loop (DLL) 1100, a compensating circuit 100, and a data output circuit 1200. The delay locked loop 1100 may delay the clock signal CK to output an inner clock signal. The compensating circuit 100 may generate the data strobe signal DQS based on the inner clock signal output from the delay locked loop 1100. The data output circuit 1200 may output the data signal DQ together with the data strobe signal DQS. The data output circuit 1200 may include a driver (not illustrated) for driving an output of each signal.

The delay locked loop 1100 may output the inner clock signal by delaying the clock signal CK as much as a determined delay amount. A phase of the inner clock signal may be locked depending on the determined delay amount.

The compensating circuit 100 may output the data strobe signal DQS by using the inner clock signal. The data strobe signal DQS may be a pulse signal having a pulse every cycle set by the user or a memory controller. The compensating circuit 100 may generate a pulse of the data strobe signal DQS depending on a voltage level of the inner clock signal. However, in the case where the inner clock signal is advanced or delayed with respect to a predetermined time due to the PVT variation, a duty ratio of the data strobe signal DQS may change, or a pulse fail may occur. In the specification, the "pulse fail" means that, due to the PVT variation, a pulse signal fails to reach a high level at a time to be switched to the high level and remains at a low level or a pulse signal fails to reach the low level at a time to be switched to the low level and remains at the high level.

The compensating circuit 100 of the inventive concept may compensate the data strobe signal DQS and may provide the memory device 1000 insensitive to the PVT variation. In descriptions below, "to compensate a signal" means that a voltage level of a signal is adjusted to a target level depending on a set cycle. For example, the inventive concept may prevent a duty ratio of the data strobe signal DQS from sharply changing or a pulse fail from occurring, due to the PVT variation, by using the compensating circuit 100.

Also, the data output circuit 1200 may output the data signal DQ to the memory controller 2000 without a delay. Accordingly, the reliability of input/output data of the memory device 1000 may be improved.

Figure 2:
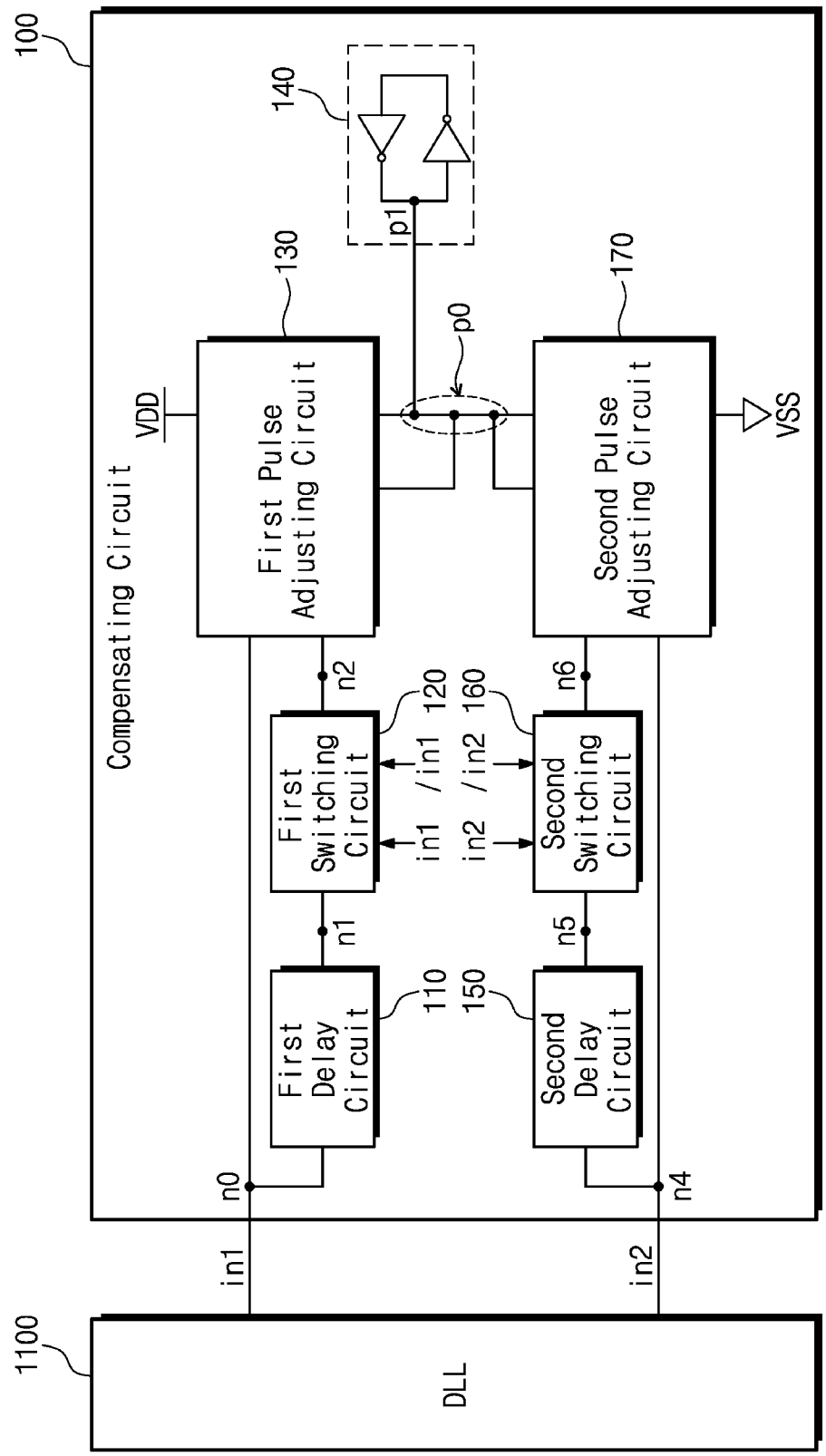
FIG. 2 is a block diagram for describing a compensating circuit of FIG. 1 according to example embodiments.

FIG. 2 is a block diagram for describing a compensating circuit of FIG. 1 according to example embodiments.

The delay locked loop 1100 may output a plurality of inner clock signals in1 and in2. The inner clock signals in1 and in2 may be signals having the same phase, but the inventive concept is not limited thereto. For example, the inner clock signals in1 and in2 are signals having different phases. Also, delay circuits such as an inverter may exist between the delay locked loop 1100 and the compensating circuit 100, and a phase difference between the inner clock signals in1 and in2 may be adjusted.

The compensating circuit 100 may generate the data strobe signal DQS by using the inner clock signals in1 and in2 received from the delay locked loop 1100. For example, the compensating circuit 100 may adjust a voltage level of a node p0 by using the inner clock signals in1 and in2 and may generate the data strobe signal DQS based on the voltage level of the node p0. For example, the compensating circuit 100 may compensate the data strobe signal DQS by adjusting the voltage level of the node p0.

The compensating circuit 100 may include a first delay circuit 110, a first switching circuit 120, a first pulse adjusting circuit 130, a fixing circuit 140, a second delay circuit 150, a second switching circuit 160, and a second pulse adjusting circuit 170. In a period where the voltage level of the node p0 increases, the compensating circuit 100 may compensate a voltage of the node p0 by using the first switching circuit 120 and the first pulse adjusting circuit 130. Also, in a period where the voltage level of the node p0 decreases, the compensating circuit 100 may compensate the voltage of the node p0 by using the second delay circuit 150, the second switching circuit 160, and the second pulse adjusting circuit 170.

The first delay circuit 110 may include one or more inverters. In descriptions below, it is assumed that the first delay circuit 110 includes two inverters, but the inventive concept is not limited thereto. The first delay circuit 110 may receive the inner clock signal in1. The first delay circuit 110 may delay the received inner clock signal in1. The first delay circuit 110 may output the delayed inner clock signal in1 to a node n1.

The first switching circuit 120 may receive the inner clock signal in1 and an inverted inner clock signal/in1. The first switching circuit 120 may determine whether to electrically connect the node n1 with a node n2, based on the inner clock signal in1 and the inverted inner clock signal/in1 thus received. When the node n2 is electrically connected to the node n1, the delayed inner clock signal in1 may be transferred from the node n1 to the node n2 through the first switching circuit 120. In this case, a voltage level of the node n2 may be equal to a voltage level of the node n1. When the node n2 is electrically disconnected from the node n1, the delayed inner clock signal in1 may not be transferred to the node n2. In this case, a voltage level of the node n2 may be irrelevant to a voltage level of the node n1.

The first pulse adjusting circuit 130 may output a first adjusting current to the node p0 from a power (VDD) supply terminal, based on the inner clock signal in1 and a voltage level of the node n2. The components 110 to 170 of the compensating circuit 100 may be provided with a driving voltage from the power supply terminal. A level of a voltage VDD may be higher than a level of a voltage VSS. Hereinafter, the voltage VDD corresponds to a power supply terminal and the voltage VSS corresponds to a ground terminal.

The first pulse adjusting circuit 130 may operate in such a way that a voltage level of the node n2 varies depending on a voltage level of the node p0. For example, the first pulse adjusting circuit 130 may be a feedback circuit that receives a voltage of the node p0 and adjusts a voltage level of the node p0. The first pulse adjusting circuit 130 may output the first adjusting current until a voltage level of the node p0 reaches a first target level and may stop outputting the first adjusting current when the voltage level of the node p0 reaches the first target level. The first target level may be higher than a voltage level of the node p0 at a time when the first adjusting current is output.

The fixing circuit 140 may include a latch circuit. In the specification, the fixing circuit 140 is illustrated as an inverter loop in which two inverters are cross-coupled, but the inventive concept is not limited thereto. In the specification, the "inverter loop" means a circuit in which an input terminal and an output terminal of one inverter of two inverters are respectively connected to an output terminal and an input terminal of the other inverter. The fixing circuit 140 may uniformly maintain a voltage level of a node p1 while there is no current that is output from the node p0 or is input to the node p0. Below, for convenience of description, it is assumed that a voltage drop does not occur in a section in which connection is made only by using an electric wire. Accordingly, it is assumed that a voltage level of the node p1 is equal to a voltage level of the node p0.

The second delay circuit 150 may include one or more inverters. In descriptions below, it is assumed that the second delay circuit 150 includes two inverters, but the inventive concept is not limited thereto. The second delay circuit 150 may receive the inner clock signal in2. The second delay circuit 150 may delay the received inner clock signal in2. The second delay circuit 150 may output the delayed inner clock signal in2 to a node n5.

The second switching circuit 160 may receive the inner clock signal in2 and an inverted inner clock signal/in2. The second switching circuit 160 may determine whether to electrically connect the node n5 with a node n6, based on the inner clock signal in2 and the inverted inner clock signal/in2 thus received. When the node n6 is electrically connected to the node n5, the delayed inner clock signal may be transferred from the node n5 to the node n6 through the second switching circuit 160. In this case, a voltage level of the node n6 may be equal to a voltage level of the node n5. When the node n6 is electrically disconnected from the node n5, the delayed inner clock signal in2 may not be transferred to the node n6. In this case, depending on an operation of the second pulse adjusting circuit 170, a voltage level of the node n6 may be irrelevant to a voltage level of the node n5.

The second pulse adjusting circuit 170 may output a second adjusting current from the node p0 to a ground terminal, based on the inner clock signal in2 and a voltage level of the node n6. The second pulse adjusting circuit 170 may operate in such a way that a voltage level of the node n6 varies depending on a voltage level of the node p0. For example, the second pulse adjusting circuit 170 may be a feedback circuit that receives a voltage of the node p0 and adjusts a voltage level of the node p0. The second pulse adjusting circuit 170 may output the second adjusting current until a voltage level of the node p0 reaches a second target level and may stop outputting the second adjusting current when the voltage level of the node p0 reaches the second target level. The second target level may be lower than the first target level. Also, the second target level may be lower than a voltage level of the node p0 at a time when the second adjusting current is output.

For example, the first switching circuit 120 may electrically disconnect the node n2 from the node n1 in a period where a voltage of the node p0 increases. Accordingly, in the period where the voltage of the node p0 increases, a voltage level of the node n2 may be irrelevant to a voltage level of the node n1 and may vary depending on a voltage level of the node p0. The first pulse adjusting circuit 130 may output the first adjusting current until a voltage level of the node n2 indicates that a voltage level of the node p0 reaches the first target level. When the voltage level of the node n2 indicates that the voltage level of the node p0 reaches the first target level, the first pulse adjusting circuit 130 may not output the first adjusting current.

The second switching circuit 160 may electrically disconnect the node n6 from the node n5 in a period where a voltage of the node p0 decreases. Accordingly, in the period where the voltage of the node p0 decreases, a voltage level of the node n6 may be irrelevant to a voltage level of the node n5 and may vary depending on a voltage level of the node p0. The second pulse adjusting circuit 170 may output the second adjusting current until a voltage level of the node n6 indicates that a voltage level of the node p0 reaches the second target level. When the voltage level of the node n6 indicates that the voltage level of the node p0 reaches the second target level, the second pulse adjusting circuit 170 may not output the second adjusting current.

For example, the compensating circuit 100 may feed back a voltage of the node p0 to adjust a voltage level of the node p0, thus preventing a duty ratio of the data strobe signal DQS from being sharply changed or a pulse fail from occurring.

Figure 3:
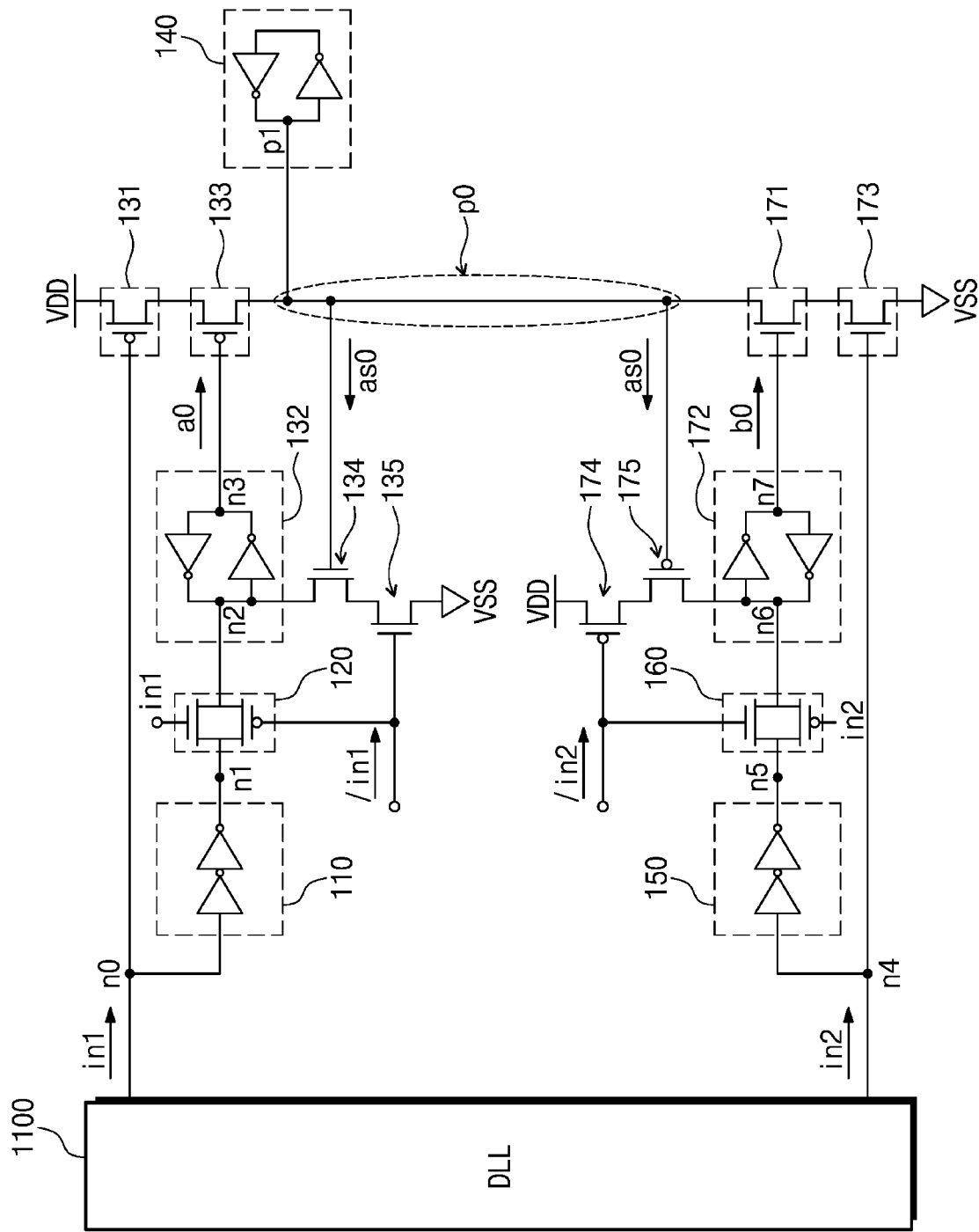
FIG. 3 is a block diagram illustrating an embodiment of a compensating circuit of FIG. 2 according to example embodiments.
Figure 4:
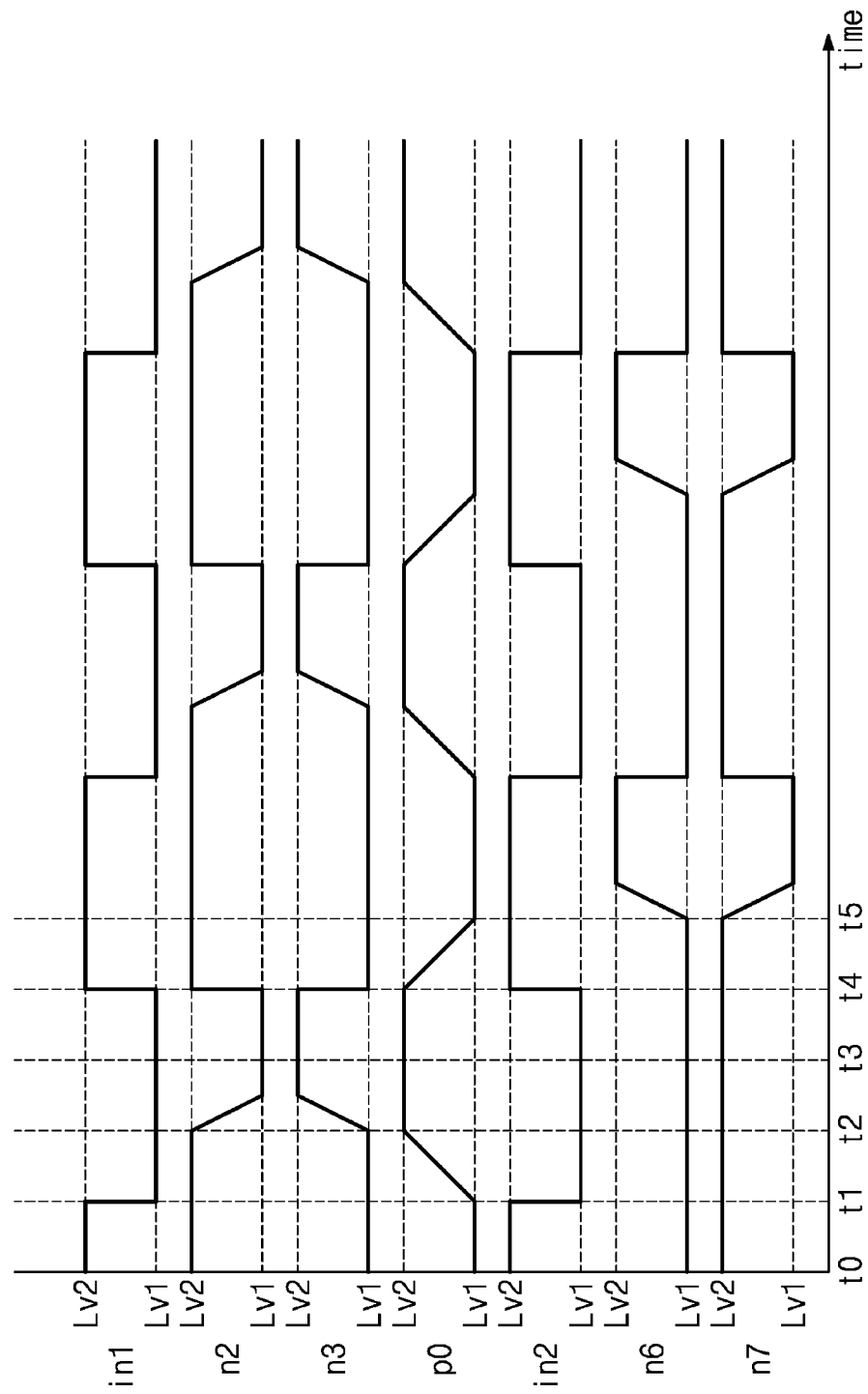
FIG. 4 is a timing diagram for describing an operation of a compensating circuit of FIG. 3 according to example embodiments.

FIG. 3 is a block diagram illustrating an embodiment of a compensating circuit of FIG. 2 according to example embodiments. FIG. 4 is a timing diagram for describing an operation of a compensating circuit of FIG. 3 according to example embodiments. FIGS. 3 and 4 will be described together. An operation of a compensating circuit in each of time periods 't0' to 't1', 't1' to 't2', 't2' to 't3', 't3' to 't4', and 't4' to 't5' illustrated in FIG. 4 will be more fully described with reference to FIGS. 7 to 11. In descriptions below, it is assumed that the first target level and the second target level described with reference to FIG. 2 are a first level Lv1 and a second level Lv2.

The delay locked loop 1100 may output the inner clock signals in1 and in2. The inner clock signals in1 and in2 may be signals having the same phase.

The first delay circuit 110 may include two inverters. The first delay circuit 110 may delay the inner clock signal in1. However, for convenience of description, it is assumed that a delay of the first delay circuit 110 does not exist.

The first switching circuit 120 may be a gate circuit composed of different transistors. One of the transistors may be a p-channel metal-oxide-semiconductor (PMOS) transistor, and the other thereof may be an n-channel metal-oxide-semiconductor (NMOS) transistor. A first terminal of the PMOS transistor may be connected to the node n1, and a second terminal of the PMOS transistor may be connected to the node n2. The inverted inner clock signal /in1 may be applied to a gate terminal of the PMOS transistor. The PMOS transistor may determine whether to output a current from the node n1 to the node n2, based on the inverted inner clock signal /in1. A first terminal of the NMOS transistor may be connected to the node n1, and a second terminal of the NMOS transistor may be connected to the node n2. The inner clock signal in1 may be applied to a gate terminal of the NMOS transistor. The NMOS transistor may determine whether to output a current from the node n1 to the node n2, based on the inner clock signal in1.

In the case where a voltage level of the inner clock signal in1 is the second level Lv2, the PMOS transistor and the NMOS transistor may respectively receive the inverted inner clock signal/in1 of the first level Lv1 and the inner clock signal in1 of the second level Lv2. A signal of a first level means that a voltage level of the signal is the first level Lv1. Also, a signal of a second level means that a voltage level of the signal is the second level Lv2.

A signal of the first level Lv1 may correspond to a digital signal having a logical value of "0". A signal of the second level Lv2 may correspond to a digital signal having a logical value of "1". In the specification, for convenience of description, it is assumed that the first level Lv1 and the second level Lv2 are equal to a level of the voltage VSS and a level of the voltage VDD, respectively.

In descriptions below, it is assumed that the PMOS transistor outputs a current from the first terminal to the second terminal when a signal of the first level Lv1 is applied to the gate terminal of the PMOS transistor and does not output a current from the first terminal to the second terminal when a signal of the second level Lv2 is applied to the gate terminal of the PMOS transistor. Also, it is assumed that the NMOS transistor outputs a current from the first terminal to the second terminal when a signal of the second level Lv2 is applied to the gate terminal of the NMOS transistor and does not output a current when a signal of the first level Lv1 is applied to the gate terminal of the NMOS transistor.

As shown in the time period 't0' to 't1', when the inner clock signal in1 of the second level Lv2 and the inverted inner clock signal/in1 of the first level Lv1 are received, the first switching circuit 120 may output a current from the node n1 to the node n2. As shown in the time period 't1' to 't2', when the inner clock signal in1 of the first level Lv1 and the inverted inner clock signal/in1 of the second level Lv2 are received, the first switching circuit 120 may not output a current from the node n1 to the node n2.

In descriptions below, that the node n1 is electrically connected to the node n2 means that a current is output from the node n1 to the node n2. Also, that the node n1 is electrically disconnected from the node n2 means that a current is not output from the node n1 to the node n2.

A voltage level of the node n2 may be equal to a voltage level of the node n1 when the node n1 is electrically connected to the node n2. In the case where the node n2 is electrically disconnected from the node n1, a voltage level of the node n2 may be determined by an operation of the first pulse adjusting circuit 130 of FIG. 2.

The first pulse adjusting circuit 130 may include transistors 131, 133, 134, and 135 and a latch circuit 132.

The latch circuit 132 may invert a phase of a signal input to the node n2. The latch circuit 132 may output a signal of the inverted phase of the signal of the node n2 to a node n3. For example, the latch circuit 132 may be an inverter loop. For example, the latch circuit 132 may operate in such a way that a voltage level of the node n3 is the second level Lv2 when a voltage level of the node n2 is the first level Lv1. Also, the latch circuit 132 may operate in such a way that a voltage level of the node n3 is the first level Lv1 when a voltage level of the node n2 is the second level Lv2.

The transistor 131 may be a PMOS transistor. A first terminal of the transistor 131 may be connected to the VDD supply terminal, and a second terminal of the transistor 131 may be connected to a first terminal of the transistor 133.

Also, the inner clock signal in1 may be applied to a gate terminal of the transistor 131. The transistor 131 may determine whether to output the first adjusting current from the VDD supply terminal to the transistor 133, based on the inner clock signal in1. However, the inventive concept is not limited thereto. For example, the transistor 131 may be an NMOS transistor. In this case, the inverted inner clock signal/in1 may be applied to the gate terminal of the transistor 131. In the specification, an NMOS transistor may be replaced with a PMOS transistor, and a PMOS transistor may be replaced with an NMOS transistor. However, in this case, a signal that is input to a gate terminal of a replaced transistor may be a signal that is opposite in phase to a signal input to a gate terminal of an original transistor. Also, a transistor of the inventive concept may be replaced with a switch that operates in response to a control signal being a signal that is input to a gate terminal of the transistor.

When the inner clock signal in1 of the first level Lv1 is received, the transistor 131 may output the first adjusting current from the VDD supply terminal to the transistor 133. When the inner clock signal in1 of the second level Lv2 is received, the transistor 131 may not output the first adjusting current from the VDD supply terminal to the transistor 133.

The transistor 133 may be a PMOS transistor. A first terminal of the transistor 133 may be connected to the second terminal of the transistor 131, and a second terminal thereof may be connected to the node p0. Also, a signal a0 may be applied to a gate terminal of the transistor 133. The signal a0 may be a voltage signal that is output from the node n3 to the transistor 133. A voltage level of the signal a0 may be equal to a voltage level of the node n3. The transistor 133 may determine whether to output the first adjusting current transferred from the transistor 131 to the node p0, based on the signal a0.

When the signal a0 of the first level Lv1 is received, the transistor 133 may output the first adjusting current to the node p0. When the signal a0 of the second level Lv2 is received, the transistor 133 may not output the first adjusting current to the node p0.

For example, as shown in the time period 't1' to 't2', when the inner clock signal in1 of the first level Lv1 and the signal a0 of the first level Lv1 are respectively applied to the transistors 131 and 133, the transistors 131 and 133 may output the first adjusting current from the VDD supply terminal to the node p0. When the first adjusting current is output to the node p0, a voltage level of the node p0 may increase.

The transistor 134 may be an NMOS transistor. A first terminal of the transistor 134 is connected to the node n2, and a second terminal thereof is connected to a first terminal of the transistor 135. A signal as0 may be applied to a gate terminal of the transistor 134. The signal as0 may be output from the node p0 to the transistor 134. A voltage level of the signal as0 may be equal to a voltage level of the node p0. The transistor 134 may determine whether to output a third adjusting current from the node n2 to the transistor 135, based on the signal as0.

When the signal as0 of the first level Lv1 is received, the transistor 134 may not output the third adjusting current from the node n2 to the transistor 135. When the signal as0 of the second level Lv2 is received, the transistor 134 may output the third adjusting current from the node n2 to the transistor 135.

The transistor 135 may be an NMOS transistor. The first terminal of the transistor 135 is connected to the second terminal of the transistor 134, and a second terminal thereof is connected to the ground terminal. The inverted inner clock signal/in1 may be applied to a gate terminal of the transistor 135. The transistor 135 may determine whether to output the third adjusting current transferred from the transistor 134 to the ground terminal, based on the inverted inner clock signal/in1.

When the inverted inner clock signal/in1 of the first level Lv1 is received, the transistor 135 may not output the third adjusting current to the ground terminal. When the inverted inner clock signal/in1 of the second level Lv2 is received, the transistor 135 may output the third adjusting current to the ground terminal.

As shown in the time period 't2' to 't3', when the signal as0 of the second level Lv2 and the inverted inner clock signal/in1 of the second level Lv2 are respectively applied to the transistors 134 and 135, the transistors 134 and 135 may output the third adjusting current from the node n2 to the ground terminal. When the third adjusting current is output from the node n2 to the ground terminal, a voltage level of the node n2 may become lower than the second level Lv2, and a voltage level of the node n3 may become higher than the first level Lv1. Accordingly, the transistor 133 may not output the first adjusting current to the node p0.

For example, the transistors 131 and 133 may output the first adjusting current until a voltage level of the node p0 increases to the second level Lv2 and may stop outputting the first adjusting current when the voltage level of the node p0 reaches the second level Lv2.

The second delay circuit 150 may include two inverters. The second delay circuit 150 may delay the inner clock signal in2. However, for convenience of description, it is assumed that a delay of the second delay circuit 150 does not exist.

The second switching circuit 160 may be a gate circuit composed of different transistors. One of the transistors may be a PMOS transistor, and the other thereof may be an NMOS transistor. The second switching circuit 160 may provide substantially the same operation as the first switching circuit 120. Thus, additional description will be omitted to avoid redundancy.

As shown in the time period 't0' to 't1', when the inner clock signal in2 of the second level Lv2 and the inverted inner clock signal/in2 of the first level Lv1 are received, the second switching circuit 160 may not output a current from the node n5 to the node n6. As shown in the time period 't2' to 't2', when the inner clock signal in2 of the first level Lv1 and the inverted inner clock signal/in2 of the second level Lv2 are received, the second switching circuit 160 may output a current from the node n5 to the node n6.

When the node n5 is electrically connected to the node n6, a voltage level of the node n6 may be equal to a voltage level of the node n5. However, when the node n5 is electrically disconnected from the node n6, a voltage level of the node n6 may not be equal to a voltage level of the node n5. In this case, a voltage level of the node n6 may be determined by an operation of the second pulse adjusting circuit 170 of FIG. 2.

The second pulse adjusting circuit 170 may include transistors 171, 173, 174, and 175 and a latch circuit 172.

The latch circuit 172 may invert a phase of a signal input to the node n6. The latch circuit 172 may provide substantially the same operation as the latch circuit 132.

The transistor 171 may be an NMOS transistor. A first terminal of the transistor 171 may be connected to the node p0, and a second terminal thereof may be connected to a first terminal of the transistor 173. Also, a signal b0 may be applied to a gate terminal of the transistor 171. The signal b0 may be a signal that is output from a node n7 to the gate terminal of the transistor 171. A voltage level of the signal b0 may be equal to a voltage level of the node n7. The transistor 171 may determine whether to output the second adjusting current from the node p0 to the transistor 173, based on the signal b0.

When the signal b0 of the first level Lv1 is received, the transistor 171 may not output the second adjusting current from the node p0 to the transistor 173. When the signal b0 of the second level Lv2 is received, the transistor 171 may output the second adjusting current from the node p0 to the transistor 173.

The transistor 173 may be an NMOS transistor. The first terminal of the transistor 173 may be connected to the second terminal of the transistor 171, and a second terminal thereof may be connected to the ground terminal. Also, the inner clock signal in2 may be applied to a gate terminal of the transistor 173. The transistor 173 may determine whether to output the second adjusting current transferred from the transistor 171 to the ground terminal, based on the inner clock signal in2.

When the inner clock signal in2 of the first level Lv1 is received, the transistor 173 may not output the second adjusting current to the ground terminal. When the inner clock signal in2 of the second level Lv2 is received, the transistor 173 may output the second adjusting current to the ground terminal.

For example, as shown in the time period 't4' to 't5', when the signal b0 of the second level Lv2 and the inner clock signal in2 of the second level Lv2 are respectively applied to the transistors 171 and 173, the transistors 171 and 173 may output the second adjusting current from the node p0 to the ground terminal. When the second adjusting current is output from the node p0 to the ground terminal, a voltage level of the node p0 may decrease.

The transistor 174 may be a PMOS transistor. A first terminal of the transistor 174 may be connected to the VDD supply terminal, and a second terminal thereof may be connected to a first terminal of the transistor 175. The inverted inner clock signal/in2 may be applied to a gate terminal of the transistor 174. The transistor 174 may determine whether to output a fourth adjusting current from the VDD supply terminal to the transistor 175, based on the inverted inner clock signal/in2.

When the inverted inner clock signal/in2 of the first level Lv1 is received, the transistor 174 may output the fourth adjusting current from the VDD supply terminal to the transistor 175. When the inverted inner clock signal/in2 of the second level Lv2 is received, the transistor 174 may not output the fourth adjusting current from the VDD supply terminal to the transistor 175.

The transistor 175 may be a PMOS transistor. The first terminal of the transistor 175 may be connected to the second terminal of the transistor 174, and a second terminal thereof may be connected to the node n6. The signal as0 may be applied to a gate terminal of the transistor 175. The signal as0 may be output from the node p0 to the transistor 175. The transistor 175 may determine whether to output the fourth adjusting current transferred from the transistor 174 to the node n6, based on the signal as0.

When the signal as0 of the first level Lv1 is received, the transistor 175 may output the fourth adjusting current to the node n6. When the signal as0 of the second level Lv2 is received, the transistor 175 may not output the fourth adjusting current to the node n6.

As shown in the time period 't4' to 't5', when the inverted inner clock signal/in2 of the first level Lv1 and the signal as0 of the first level Lv1 are respectively applied to the transistors 174 and 175, the transistors 174 and 175 may output the fourth adjusting current from the VDD supply terminal to the node n6. When the fourth adjusting current is output from the VDD supply terminal to the node n6, a voltage level of the node n6 may become higher than the first level Lv1, and a voltage level of the node n7 may become lower than the second level Lv2.

For example, the transistors 171 and 173 may output the second adjusting current until a voltage level of the node p0 decreases to the first level Lv1 and may stop outputting the second adjusting current when the voltage level of the node p0 reaches the first level Lv1.

Figure 5:
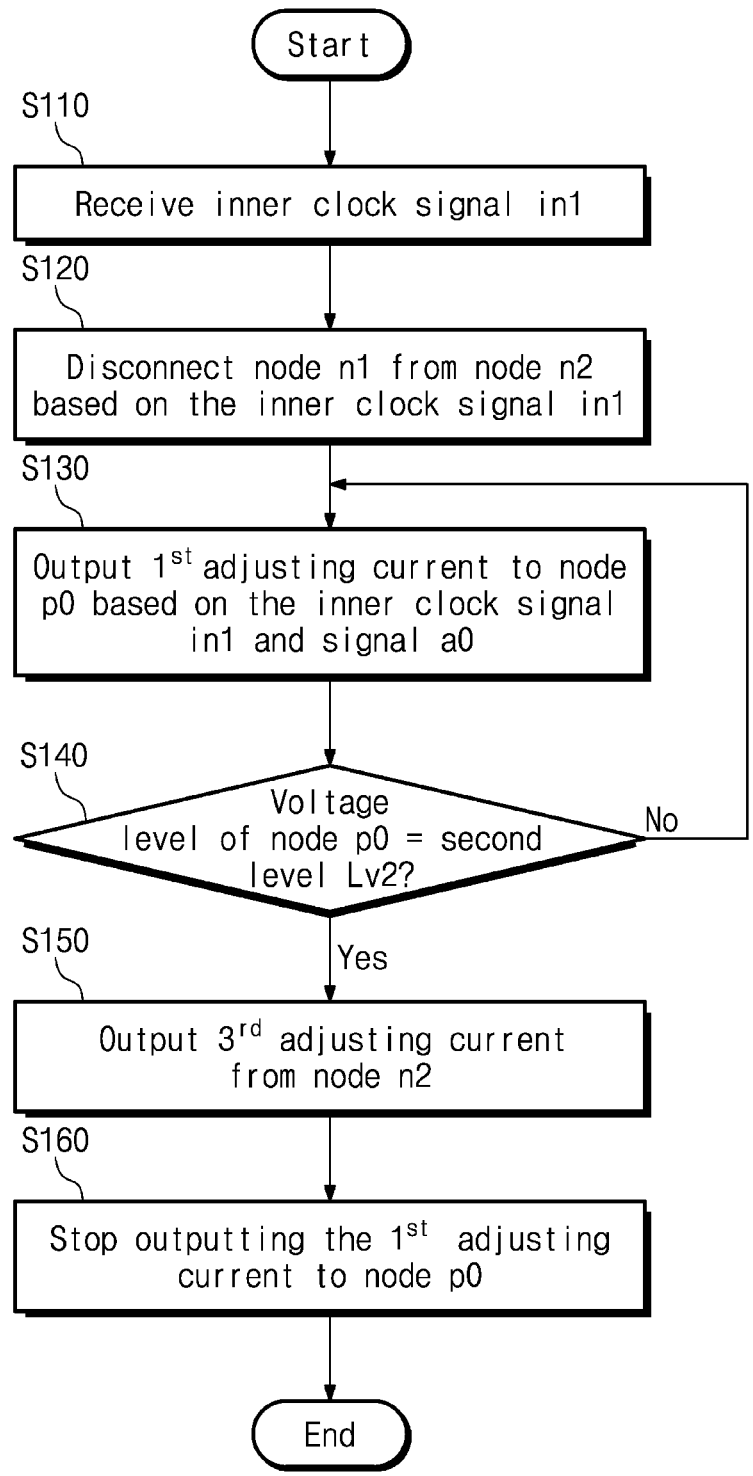
FIG. 5 is a flowchart for describing an operation of a compensating circuit of FIG. 3 according to example embodiments.

FIG. 5 is a flowchart for describing an operation of a compensating circuit of FIG. 3 according to example embodiments.

An operation of the compensating circuit 100 of FIG. 3 in the time period 't1' to 't2' of FIG. 4 will be described with reference to FIG. 5.

In operation S110, the compensating circuit 100 may receive the inner clock signal in1 of the first level Lv1.

In operation S120, the first switching circuit 120 may electrically disconnect the node n1 from the node n2 when the inner clock signal in1 of the first level Lv1 is received. In this case, a voltage level of the node n2 may be maintained at a voltage level determined before the time 't1'. A voltage level of the node n3 may be maintained at the first level Lv1 by the latch circuit 132.

In operation S130, the transistors 131 and 133 may receive the inner clock signal in1 of the first level Lv1 and the signal a0 of the first level Lv1, respectively. The transistors 131 and 133 may output the first adjusting current to the node p0 from the VDD supply terminal, based on the inner clock signal in1 and the signal a0.

In operation S140, the transistor 134 may determine whether to output the third adjusting current from the node n2 to the transistor 135, depending on whether a voltage level of the node p0 reaches the second level Lv2.

When the voltage level of the node p0 does not reach the second level Lv2, operation S130 may be again performed. Also, the transistor 134 may not output the third adjusting current from the node n2 to the transistor 135.

When the voltage level of the node p0 reaches the second level Lv2, operation S150 may be performed. In operation S150, the transistor 134 may output the third adjusting current from the node n2 to the transistor 135. The transistor 135 may also output the third adjusting current thus transferred to the ground terminal. Accordingly, a voltage level of the node n2 may decrease.

In operation S160, when the voltage level of the node n2 is lower than the second level Lv2, the transistor 133 may stop outputting the first adjusting current to the node p0.

Figure 6:
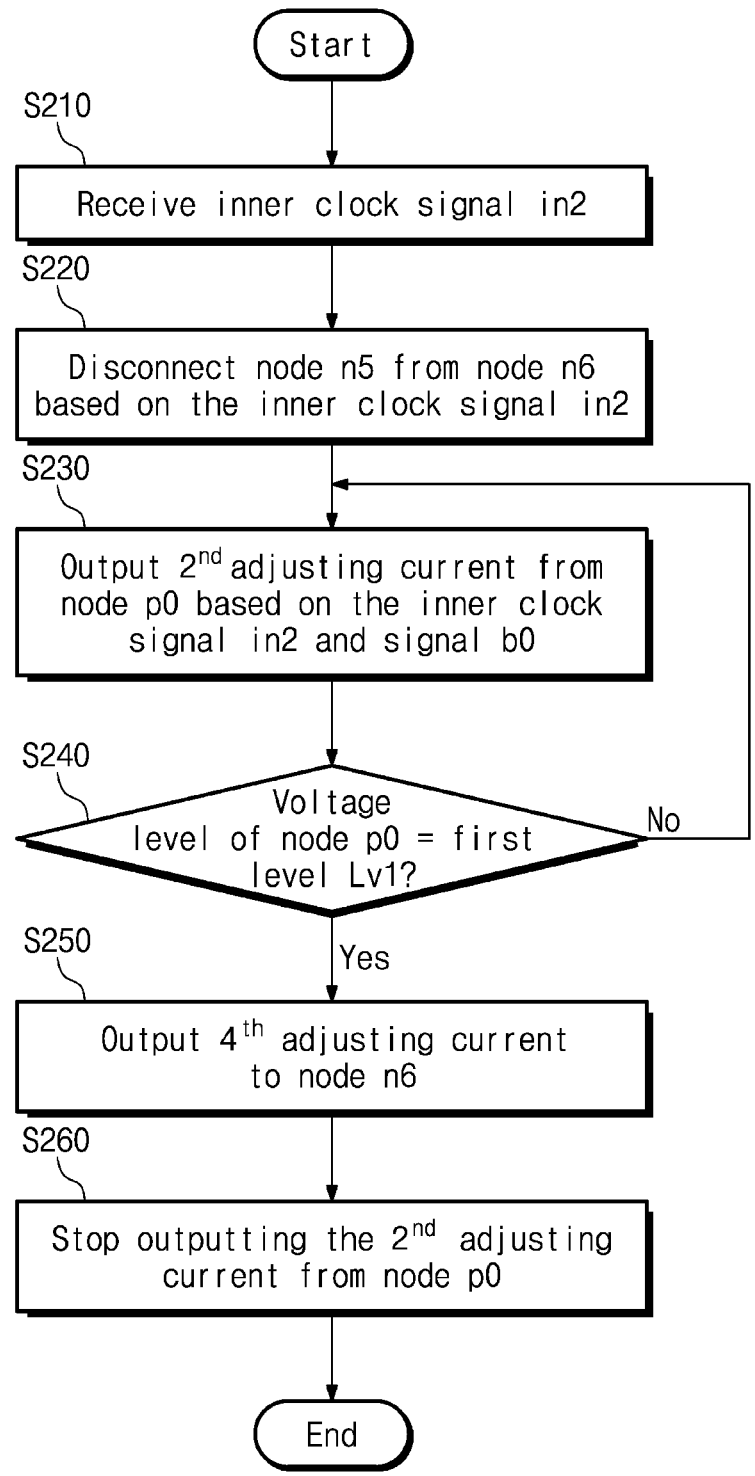
FIG. 6 is a flowchart for describing an operation of a compensating circuit of FIG. 3 according to example embodiments.

FIG. 6 is a flowchart for describing an operation of a compensating circuit of FIG. 3 according to example embodiments.

An operation of the compensating circuit 100 of FIG. 3 in the time period 't3' to 't4' of FIG. 4 will be described with reference to FIG. 6.

In operation S210, the compensating circuit 100 may receive the inner clock signal in2 of the second level Lv2.

In operation S220, the second switching circuit 160 may electrically disconnect the node n5 from the node n6 when the inner clock signal in2 of the second level Lv2 is received. In this case, a voltage level of the node n6 may be maintained at a voltage level determined before the time 't3'. A voltage level of the node n7 may be maintained at the second level Lv2 by the latch circuit 172.

In operation S230, the transistors 171 and 173 may receive the inner clock signal in2 of the second level Lv2 and the signal b0 of the second level Lv2, respectively. The transistors 171 and 173 may output the third adjusting current to the node p0 from the ground terminal, based on the inner clock signal in2 and the signal b0.

In operation S240, the transistor 175 may determine whether to output the fourth adjusting current from the transistor 174 to the node n6, depending on whether a voltage level of the node p0 is reaches the first level Lv1.

When the voltage level of the node p0 does not reach the first level Lv1, operation S230 may be again performed. Also, the transistor 175 may not output the fourth adjusting current from the transistor 174 to the node n6.

When the voltage level of the node p0 reaches the first level Lv1, operation S250 may be performed. In operation S250, the transistor 174 may output the fourth adjusting current from the VDD supply terminal to the transistor 175. The transistor 175 may output the fourth adjusting current thus transferred to the node n6. Accordingly, a voltage level of the node n6 may increase.

In operation S260, when the voltage level of the node n6 is higher than the first level Lv1, the transistor 171 may stop outputting the second adjusting current from the node p0.

Figure 7:
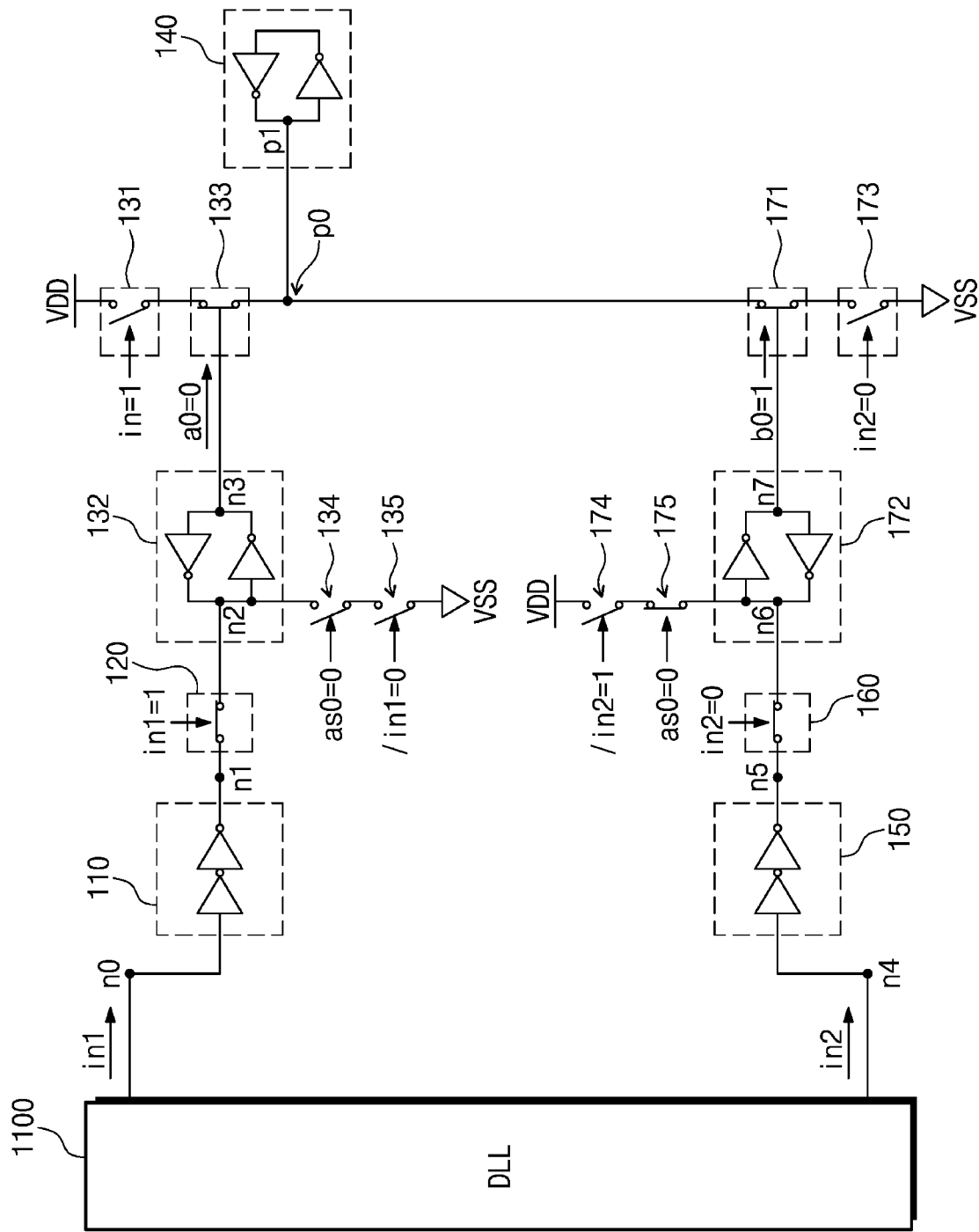
FIG. 7 is a block diagram for describing an operation of a compensating circuit of FIG. 3 in a specific time period, according to example embodiments.

FIG. 7 is a block diagram for describing an operation of a compensating circuit of FIG. 3 in a specific time period, according to example embodiments. An operation of the compensating circuit 100 of FIG. 3 in the time period 't0' to 't1' of FIG. 4 will be described with reference to FIG. 7. In drawings below, the expression "in1=1" means that a voltage level of the inner clock signal in1 is the second level Lv2. Also, the expression "in1=0" means that a voltage level of the inner clock signal in1 is the first level Lv1. The above expressions are also applied to the remaining signals.

Because the inner clock signal in1 of the second level Lv2 is applied, the first switching circuit 120 may electrically connect the node n1 and the node n2. Accordingly, a voltage level of the node n2 may be equal to the second level Lv2. Because the voltage level of the node n2 is the second level Lv2, a voltage level of the node n3 may be the first level Lv1.

When the inner clock signal in1 of the second level Lv2 is applied, the transistor 131 may not output the first adjusting current from the VDD supply terminal to the transistor 133. Accordingly, the first adjusting current may not be output to the node p0 regardless of a voltage level of the signal a0.

It is assumed that a voltage of the node p0 is the first level Lv1, the transistor 134 may not output the third adjusting current from the node n2 to the transistor 135. Accordingly, the third adjusting current may not be output from the node n2 to the ground terminal, regardless of a voltage level of the inverted inner clock signal/in1.

Because the inner clock signal in2 of the first level Lv1 is applied, the second switching circuit 160 may electrically connect the node n5 and the node n6. Accordingly, a voltage level of the node n6 may be equal to the first level Lv1. Because the voltage level of the node n6 is the first level Lv1, a voltage level of the node n7 may be the second level Lv2.

When the inner clock signal in2 of the first level Lv1 is applied, the transistor 173 may not output the second adjusting current to the ground terminal. Accordingly, the second adjusting current may not be output from the node p0 to the ground terminal, regardless of a voltage level of the signal b0.

When the inverted inner clock signal/in2 of the second level Lv2 is applied, the transistor 174 may not output the fourth adjusting current from the VDD supply terminal to the transistor 175. Accordingly, the fourth adjusting current may not be output from the VDD supply terminal to the node n6 regardless of a voltage level of the signal as0.

Because the first adjusting current and the third adjusting current are not output, a voltage level of the node p0 may be maintained at the first level Lv1.

Figure 8:
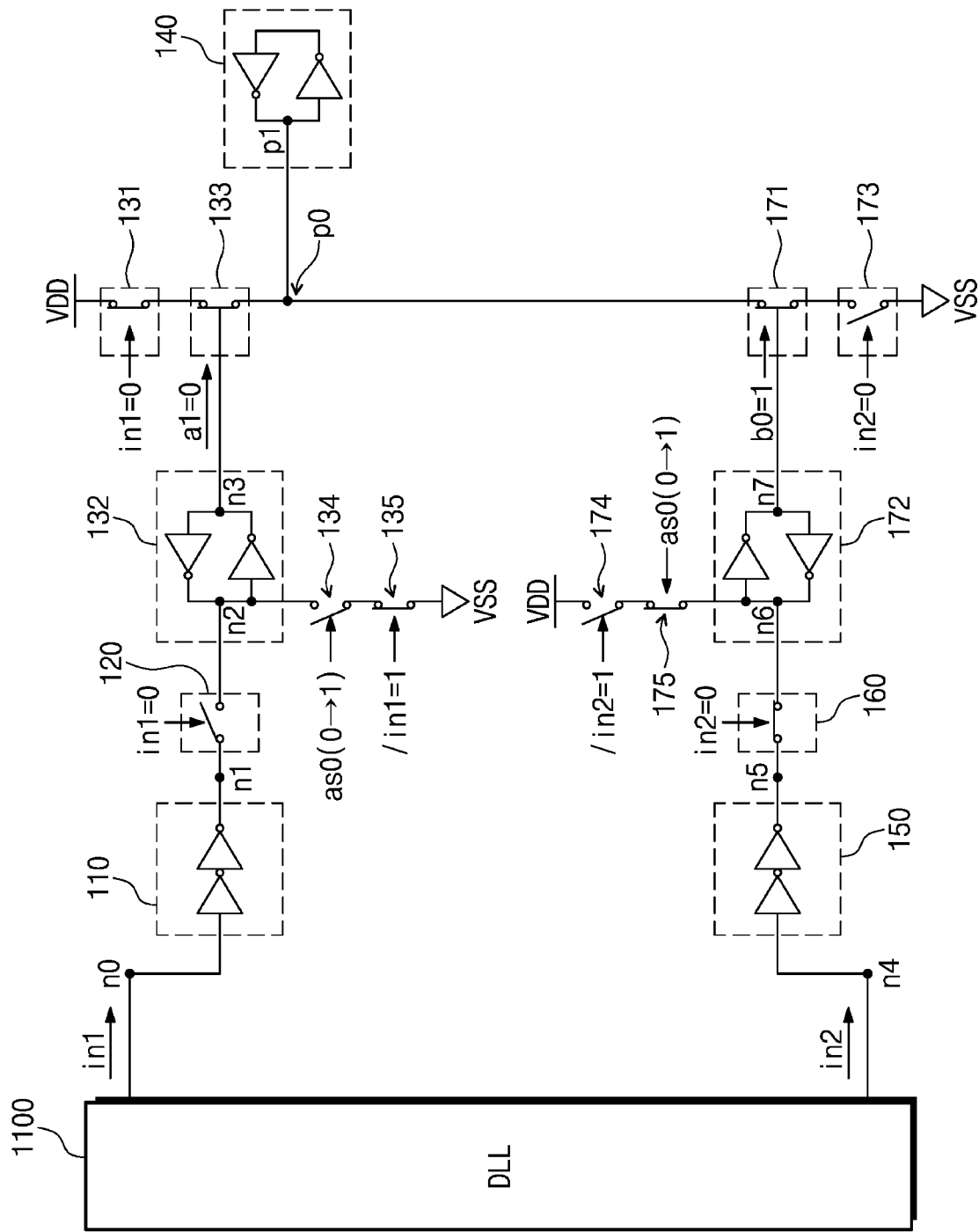
FIG. 8 is a block diagram for describing an operation of a compensating circuit of FIG. 3 in a specific time period, according to example embodiments.

FIG. 8 is a block diagram for describing an operation of a compensating circuit of FIG. 3 in a specific time period, according to example embodiments. An operation of the compensating circuit 100 of FIG. 3 in the time period 't1' to 't2' of FIG. 4 will be described with reference to FIG. 8.

Because the inner clock signal in1 of the first level Lv1 is applied, the first switching circuit 120 may electrically disconnect the node n1 from the node n2. Accordingly, a voltage level of the node n2 may be maintained at the second level Lv2 regardless of a voltage level of the node n1. Because the voltage level of the node n2 is the second level Lv2, a voltage level of the node n3 may be the first level Lv1.

When the inner clock signal in1 of the first level Lv1 is applied, the transistor 131 may output the first adjusting current from the VDD supply terminal to the transistor 133. Also, because the voltage level of the node n3 is the first level Lv1, the transistor 133 may also output the first adjusting current thus transferred to the node p0.

Because a voltage of the node p0 does not reach the second level Lv2, the transistor 134 may not output the third adjusting current from the node n2 to the transistor 135. Accordingly, the third adjusting current may not be output from the node n2 to the ground terminal, regardless of the inverted inner clock signal/in1.

Because a voltage level of the inner clock signal in2 is equal to that in the time period 't0' to 't1', operations of the components 150, 160, and 171 to 175 may be identical to those described with reference to FIG. 7. Accordingly, the second adjusting current and the fourth adjusting current may not be output.

Because only the first adjusting current is output and the second adjusting current is not output, a voltage level of the node p0 may increase from the first level Lv1 to the second level Lv2.

Figure 9:
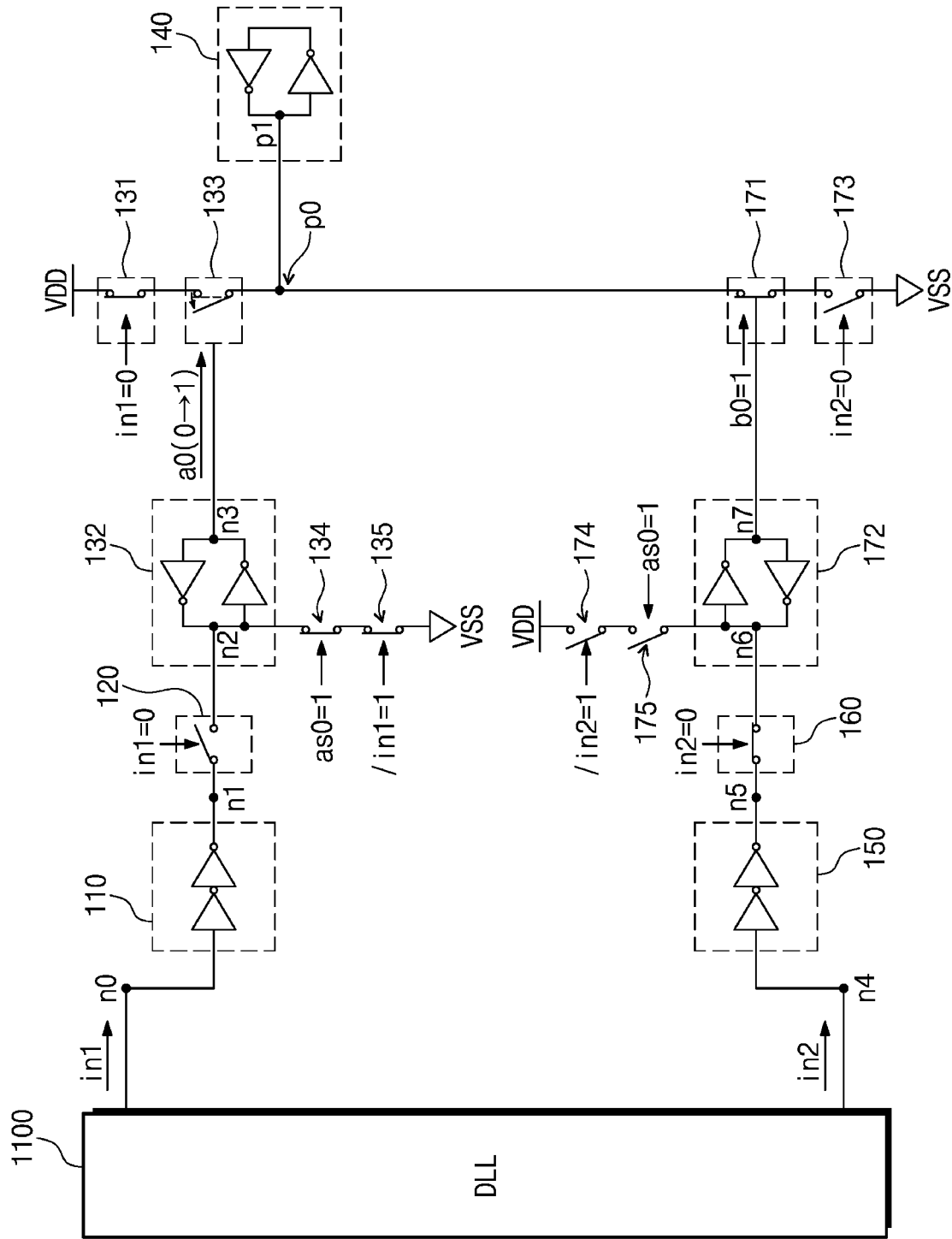
FIG. 9 is a block diagram for describing an operation of a compensating circuit of FIG. 3 in a specific time period, according to example embodiments.

FIG. 9 is a block diagram for describing an operation of a compensating circuit of FIG. 3 in a specific time period, according to example embodiments. An operation of the compensating circuit 100 of FIG. 3 in the time period 't2' to 't3' of FIG. 4 will be described with reference to FIG. 9.

Because a voltage level of the inner clock signal in1 is equal to that in the time period 't1' to 't2', operations of the components 110 and 120 may be identical to those described with reference to FIG. 8. Accordingly, a voltage level of the node n2 may be irrelevant to a voltage level of the node n1.

Because a voltage of the node p0 reaches the second level Lv2, the transistor 134 may output the third adjusting current from the node n2 to the transistor 135. Also, because the inverted inner clock signal/in1 of the second level Lv2 is applied, the transistor 135 may output the third adjusting current thus transferred to the ground terminal. Accordingly, a voltage level of the node n2 may decrease from the second level Lv2 to the first level Lv1. As the voltage of the node n2 is changed, a voltage level of the node n3 may increase from the first level Lv1 to the second level Lv2.

As the voltage level of the node n3 increases to the second level Lv2, the amount of the first adjusting current being output to the node p0 through the transistor 133 may decrease. As soon as the voltage level of the node n3 becomes the second level Lv2, the transistor 133 may stop outputting the first adjusting current to the node p0.

Because a voltage level of the inner clock signal in2 is equal to that in the time period 't0' to 't1', operations of the components 150, 160, and 171 to 174 may be identical to those described with reference to FIG. 7. The transistor 175 may be turned off based on the node p0 of the second level Lv2. Accordingly, the second adjusting current and the fourth adjusting current may not be output.

For example, because the first adjusting current and the second adjusting current are not output from a time when the voltage level of the node n3 becomes the second level Lv2, a voltage level of the node p0 may be maintained at the second level Lv2 by the fixing circuit 140.

Figure 10:
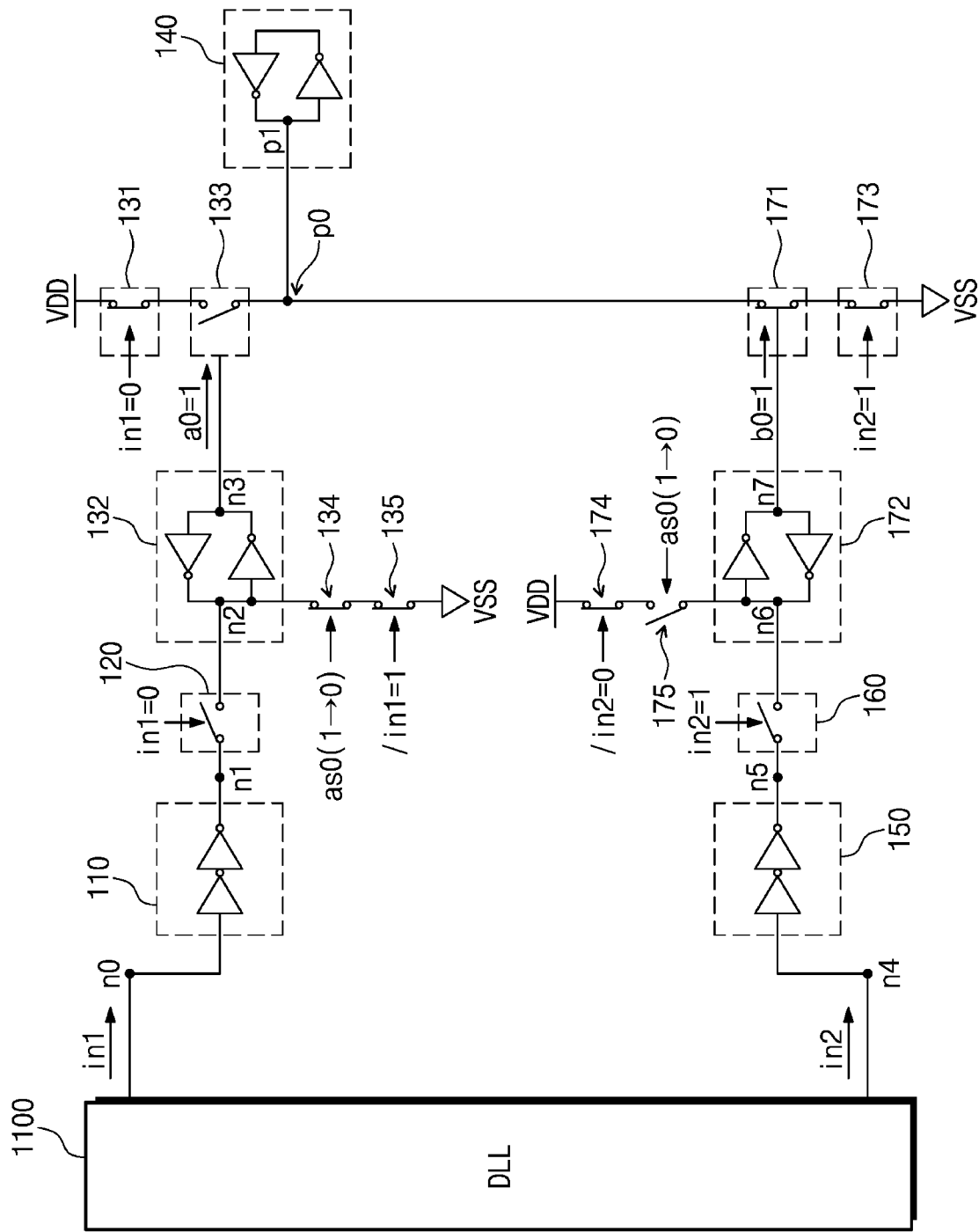
FIG. 10 is a block diagram for describing an operation of a compensating circuit of FIG. 3 in a specific time period, according to example embodiments.

FIG. 10 is a block diagram for describing an operation of a compensating circuit of FIG. 3 in a specific time period, according to example embodiments. An operation of the compensating circuit 100 of FIG. 3 in the time period 't3' to 't4' of FIG. 4 will be described with reference to FIG. 10.

Because a voltage level of the inner clock signal in1 is equal to that in the time period 't2' to 't3', operations of the components 110, 120, and 131 to 135 may be identical to those described with reference to FIG. 9. Accordingly, the first adjusting current may not be output, and only the third adjusting current may be output.

Because the inner clock signal in2 of the second level Lv2 is applied, the second switching circuit 160 may electrically disconnect the node n5 from the node n6. Accordingly, a voltage level of the node n6 may be maintained at the first level Lv1 regardless of a voltage level of the node n5. Because the voltage level of the node n6 is the first level Lv1, a voltage level of the node n7 may be the second level Lv2.

Because the voltage level of the node n7 is the second level Lv2, the transistor 171 may output the second adjusting current from the node p0 to the transistor 173. Also, because the inner clock signal in2 of the second level Lv2 is applied, the transistor 173 may output the third adjusting current transferred from the transistor 171 to the ground terminal.

Because a voltage of the node p0 does not reach the first level Lv1, the transistor 175 may not output the fourth adjusting current to the node n6. Accordingly, the fourth adjusting current may not be output from the VDD supply terminal to the node n6 regardless of a voltage level of the inner clock signal in2.

Because only the second adjusting current is output and the first adjusting current is not output, a voltage of the node p0 may decrease from the second level Lv2 to the first level Lv1.

Figure 11:
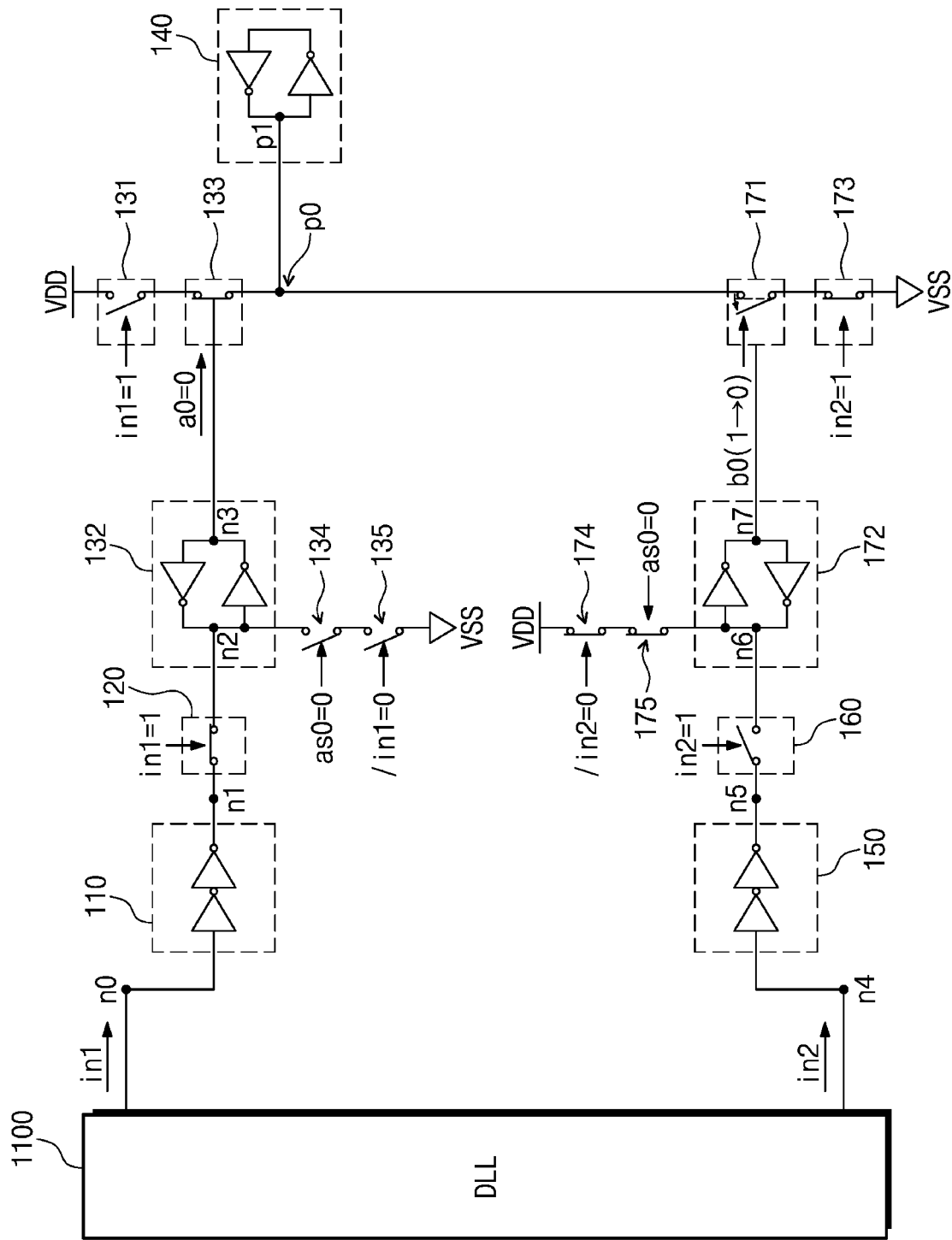
FIG. 11 is a block diagram for describing an operation of a compensating circuit of FIG. 3 in a specific time period, according to example embodiments.

FIG. 11 is a block diagram for describing an operation of a compensating circuit of FIG. 3 in a specific time period, according to example embodiments. An operation of the compensating circuit 100 of FIG. 3 in the time period 't4' to 't5' of FIG. 4 will be described with reference to FIG. 11.

Because a voltage level of the inner clock signal in1 is equal to that in the time period 't0' to 't1', operations of the components 110, 120, and 131 to 135 may be identical to those described with reference to FIG. 7. Accordingly, the first adjusting current and the third adjusting current may not be output.

Because a voltage level of the inner clock signal in2 is equal to that in the time period 't3' to 't4', operations of the components 150 and 160 may be identical to those described with reference to FIG. 10. Accordingly, a voltage level of the node n6 may be irrelevant to a voltage level of the node n5.

When the inverted inner clock signal /in2 of the first level Lv1 is applied, the transistor 174 may output the fourth adjusting current from the VDD supply terminal to the transistor 175. Also, because a voltage level of the node p0 is the first level Lv1, the transistor 175 may output the fourth adjusting current transferred from the transistor 174 to the node n6. Accordingly, a voltage level of the node n6 may increase from the first level Lv1 to the second level Lv2. As the voltage of the node n6 is changed, a voltage level of the node n7 may decrease from the second level Lv2 to the first level Lv1.

As the voltage level of the node n7 decreases to the first level Lv1, the amount of the second adjusting current being output from the node p0 through the transistor 171 may decrease. As soon as the voltage level of the node n7 becomes the first level Lv1, the transistor 171 may stop outputting the second adjusting current from the node p0.

For example, because the first adjusting current and the second adjusting current are not output from a time when the voltage level of the node n7 becomes the first level Lv1, a voltage level of the node p0 may be maintained at the first level Lv1 by the fixing circuit 140.

Figure 12:
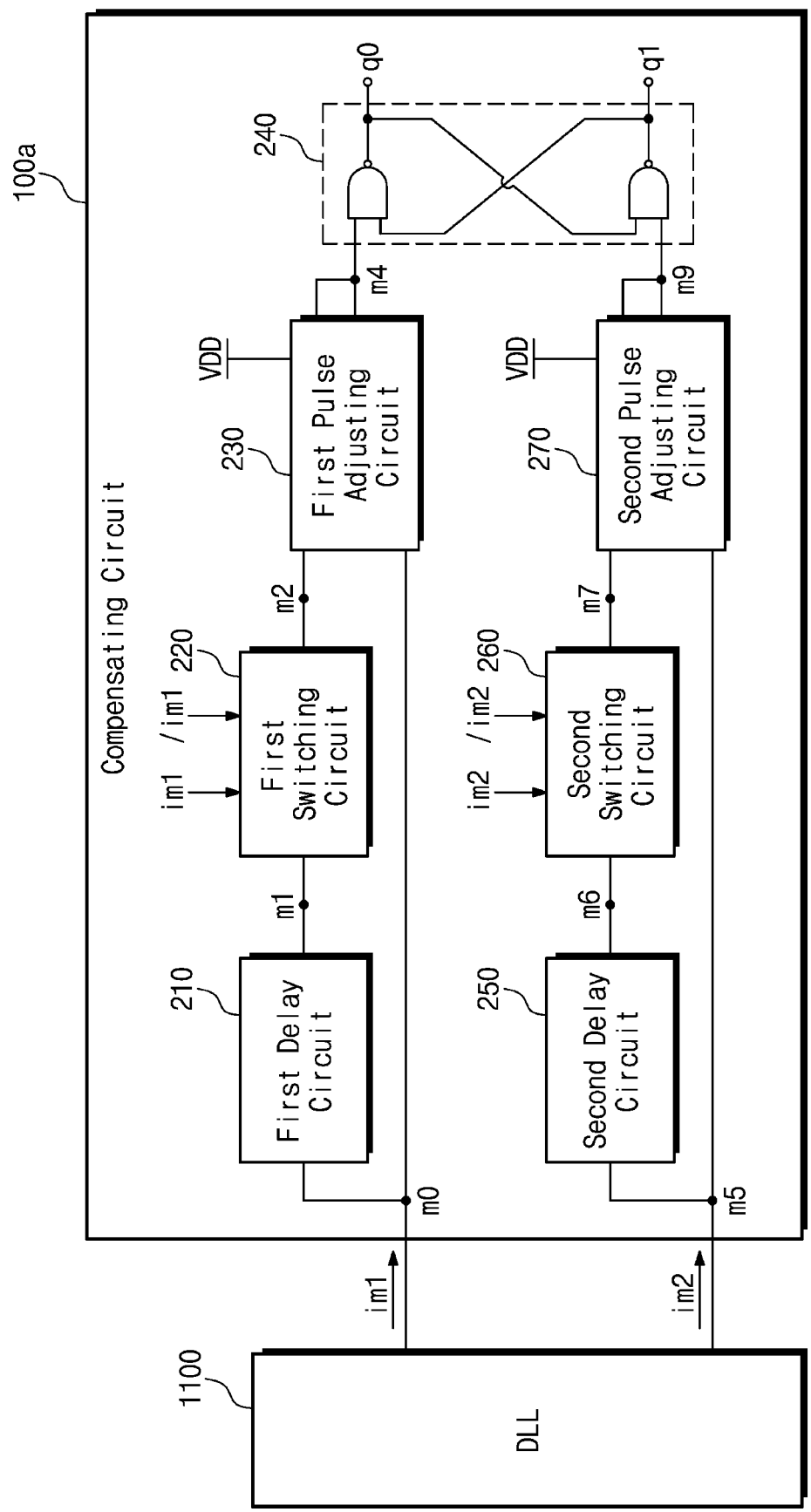
FIG. 12 is a block diagram illustrating an embodiment of a compensating circuit of FIG. 1 according to example embodiments.

FIG. 12 is a block diagram illustrating an embodiment of a compensating circuit of FIG. 1 according to example embodiments.

A compensating circuit 100a corresponds to an embodiment of the compensating circuit 100 of FIG. 1. Components 210, 220, 250, and 260 may provide substantially the same operations as the components 110, 120, 150, and 160 of FIG. 2, and thus, additional description will be omitted to avoid redundancy. A description to be given with reference to FIG. 12 will be focused on the components 230 and 270.

The first pulse adjusting circuit 230 may output a fifth adjusting current from the VDD supply terminal to a node m2, based on an inner clock signal im1 and a voltage level of a node m4. A voltage level of the node m2 may vary depending on the fifth adjusting current output to the node m2.

The first pulse adjusting circuit 230 may operate in such a way that a voltage level of the node m4 varies depending on the inner clock signal im1 and a voltage level of the node m2. For example, the first pulse adjusting circuit 230 may be a feedback circuit that receives a voltage level of the node m4 and adjusts a voltage level of the node m4.

The first pulse adjusting circuit 230 may output the fifth adjusting current until a voltage level of the node m4 reaches the second target level and may stop outputting the fifth adjusting current when the voltage level of the node m4 reaches the second target level. The second target level may be higher than a voltage level of the node m4 at a time when the fifth adjusting current is output. The second target level may be the second level Lv2 as described with reference to FIGS. 3 and 4.

The second pulse adjusting circuit 270 may output a sixth adjusting current from the VDD supply terminal to a node m7, based on an inner clock signal im2 and a voltage level of a node m9. A voltage level of the node m7 may vary depending on the sixth adjusting current output to the node m7.

The second pulse adjusting circuit 270 may operate in such a way that a voltage level of the node m9 varies depending on the inner clock signal im2 and a voltage level of the node m7. For example, the second pulse adjusting circuit 270 may be a feedback circuit that receives a voltage level of the node m9 and adjusts a voltage level of the node m9.

The second pulse adjusting circuit 270 may output the sixth adjusting current until a voltage level of the node m9 reaches the second target level and may stop outputting the sixth adjusting current when the voltage level of the node m9 reaches the second target level. The first target level may be lower than a voltage level of the node m9 at a time when the sixth adjusting current is output. The first target level may be the first level Lv1 as described with reference to FIGS. 3 and 4.

The fixing circuit 240 may be a set/reset (SR) latch circuit. However, the inventive concept is not limited thereto. For example, the fixing circuit 240 may be a circuit that controls voltage levels of nodes q0 and q1 based on voltage levels of the nodes m4 and m9. The fixing circuit 240 may adjust voltage levels of the nodes q0 and q1 based on voltage levels of the nodes m4 and m9. Also, the compensating circuit 100a may generate the data strobe signal DQS based on voltage levels of the nodes q0 and q1.

The compensating circuit 100a may feed back a voltage of the node m4 to adjust a voltage level of the node m4 and may feed back a voltage of the node m9 to adjust a voltage level of the node m9. For example, the compensating circuit 100a may react to the PVT variation more insensitively when adjusting voltage levels of the nodes m4 and m9. Accordingly, as voltages of the nodes m4 and m9 are fed back, the compensating circuit 100a may prevent a pulse fail from occurring at the data strobe signal DQS.

Figure 13:
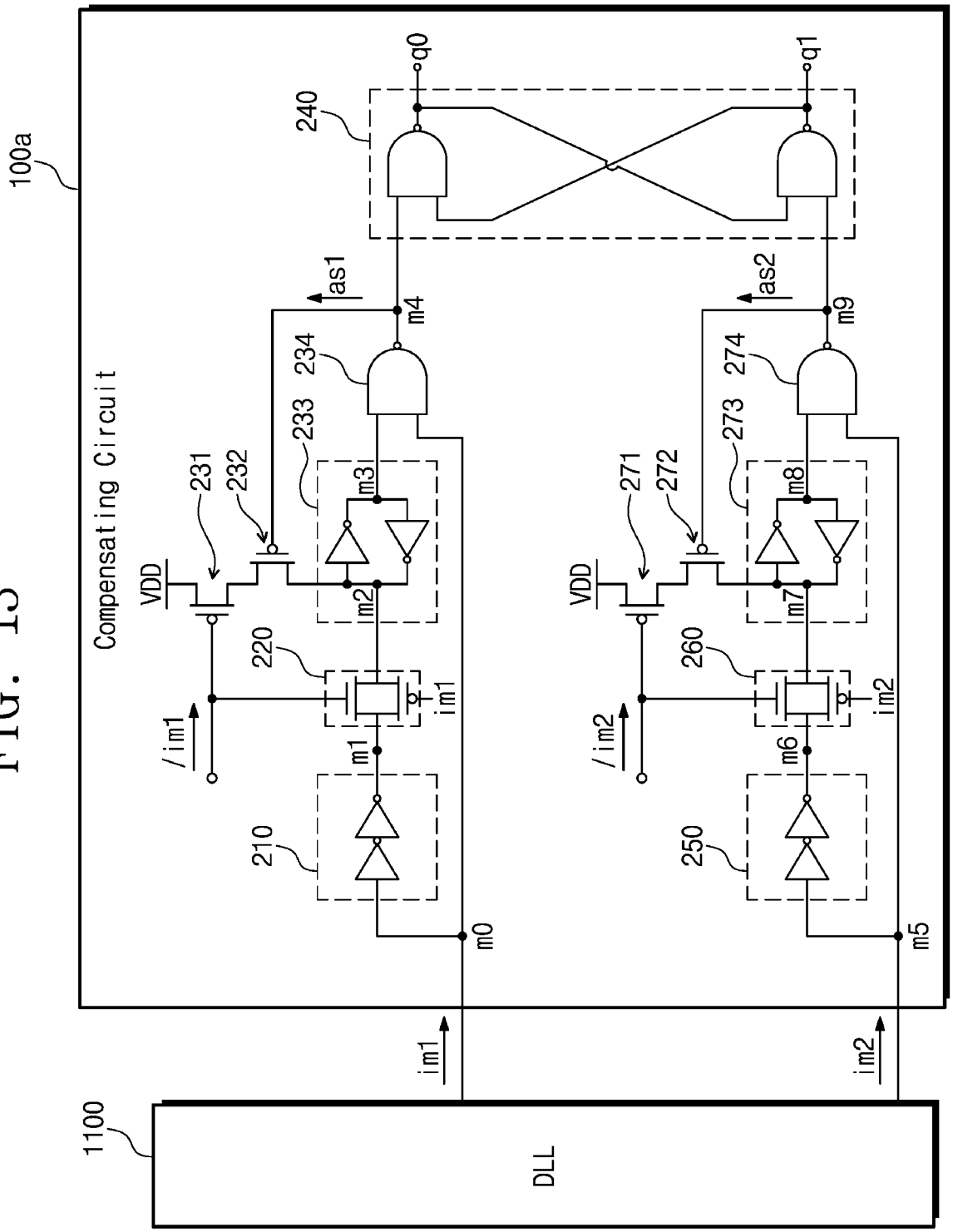
FIG. 13 is a block diagram illustrating an embodiment of a compensating circuit of FIG. 12 according to example embodiments.

FIG. 13 is a block diagram illustrating an embodiment of a compensating circuit of FIG. 12 according to example embodiments.

The components 210, 220, 250, and 260 may provide substantially the same operations as the components 110, 120, 150, and 160 of FIG. 3, and thus, additional description will be omitted to avoid redundancy. A description to be given with reference to FIG. 12 will be focused on the components 231 to 234 and 271 to 274.

A delay locked loop 1100 may output the inner clock signals im1 and im2. A phase difference may exist between the inner clock signals im1 and im2.

The first delay circuit 210 may delay the inner clock signal im1. However, for convenience of description, it is assumed that a delay of the first delay circuit 210 does not exist.

The first switching circuit 220 may be a gate circuit composed of different transistors. One of the transistors may be a PMOS transistor, and the other thereof may be an NMOS transistor. The PMOS transistor may determine whether to output a current from a node m1 to the node m2, based on the inner clock signal im1 applied to a gate terminal thereof. The NMOS transistor may determine whether to output a current from the node m1 to the node m2, based on an inverted inner clock signal/im1 applied to a gate terminal thereof.

A voltage level of the node m2 may be equal to a voltage level of the node m1 when the node m1 is electrically connected to the node m2. However, when the node m1 is electrically disconnected from the node m2, a voltage level of the node m2 may not be equal to a voltage level of the node m1. In this case, a voltage level of the node m2 may be determined by an operation of the first pulse adjusting circuit 230 of FIG. 12.

The first pulse adjusting circuit 230 may include transistors 231 and 232, a latch circuit 233, and a logic gate 234.

The latch circuit 233 may operate in such a way that a voltage level of a node m3 is the second level Lv2 when a voltage level of the node m2 is the first level Lv1. Also, the latch circuit 233 may operate in such a way that a voltage level of the node m3 is the first level Lv1 when a voltage level of the node m2 is the second level Lv2.

The transistor 231 may be a PMOS transistor. A first terminal of the transistor 231 may be connected to the VDD supply terminal, and a second terminal thereof may be connected to a first terminal of the transistor 232. The inverted inner clock signal/im1 may be applied to a gate terminal of the transistor 231. The transistor 231 may determine whether to output the fifth adjusting current from the VDD supply terminal to the transistor 232, based on the inverted inner clock signal/im1.

The transistor 232 may be a PMOS transistor. The first terminal of the transistor 232 may be connected to the second terminal of the transistor 231, and a second terminal thereof may be connected to the node m2. Also, a signal as1 may be applied to a gate terminal of the transistor 232. The signal as1 may be a voltage signal that is output from the node m4 to the transistor 232. A voltage level of the signal as1 may be equal to a voltage level of the node m4. The transistor 232 may determine whether to output the fifth adjusting current transferred from the transistor 231 to the node m2, based on the signal as1.

The logic gate 234 may perform a logical operation on a voltage level of the node m3 and a voltage level of the inner clock signal im1 and may adjust a voltage level of the node m4. In descriptions below, it is assumed that the logic gate 234 is a NAND gate, but the inventive concept is not limited thereto. For example, the logic gate 234 may be a NOR gate. The logic gate 234 may adjust a voltage level of the node m4 to the first level Lv1 when both a voltage level of the node m3 and a voltage level of the inner clock signal im1 are the second level Lv2. The logic gate 234 may adjust a voltage level of the node m4 to the second level Lv2 when at least one of a voltage level of the node m3 and a voltage level of the inner clock signal im1 is the first level Lv1.

For example, the transistors 231 and 232 may determine whether to output the fifth adjusting current based on a voltage level of the node m4 and a voltage level of the inverted inner clock signal/im1. When the fifth adjusting current is output to the node m2 through the transistors 231 and 232, a voltage level of the node m2 may be changed. As the voltage level of the node m2 is changed, a voltage level of the node m4 may also be changed.

The components 250, 260, and 271 to 274 may provide substantially the same operations as the components 210, 220, and 231 to 234, and thus, additional description will be omitted to avoid redundancy.

Figure 14:
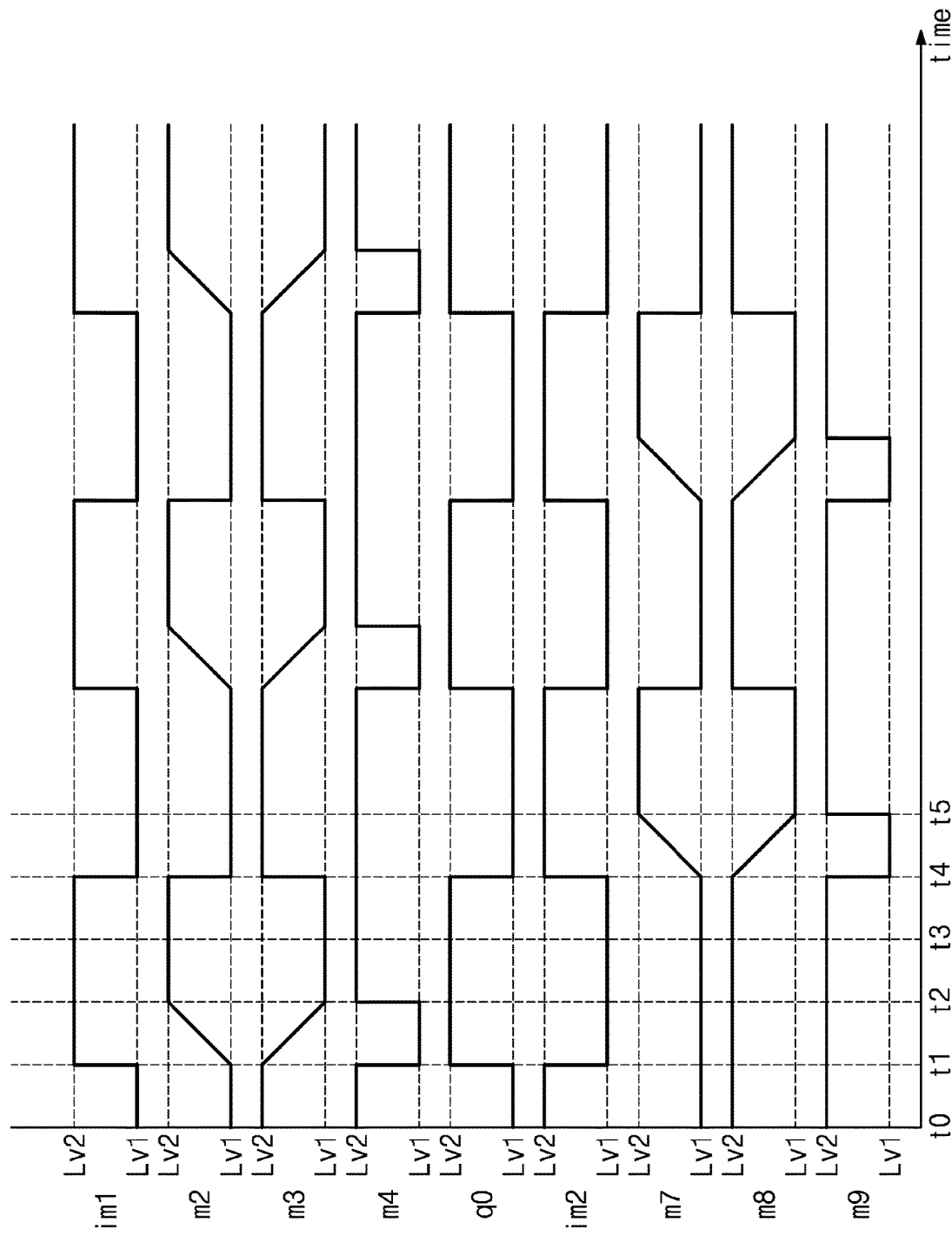
FIG. 14 is a timing diagram for describing an operation of a compensating circuit of FIG. 13 according to example embodiments.

FIG. 14 is a timing diagram for describing an operation of a compensating circuit of FIG. 13 according to example embodiments.

In a time period 't0' to 't1', the inner clock signal iml of the first level Lv1 and the inner clock signal im2 of the second level Lv2 may be received.

Because the inner clock signal iml of the first level Lv1 is applied, the first switching circuit 220 may electrically connect the node m1 and the node m2. Accordingly, a voltage level of the node m2 and a voltage level of the node m3 may be the first level Lv1 and the second level Lv2, respectively.

Because the voltage level of the inner clock signal iml is the first level Lv1 regardless of a voltage level of the node m3, the logic gate 234 may output a voltage level of the node m4 having the second level Lv2. Because the voltage level of the node m4 is the second level Lv2, the transistor 232 may not output the fifth adjusting current to the node m2.

Because the voltage level of the inner clock signal im2 is equal to the second level Lv2, the second switching circuit 260 may electrically disconnect the node m6 from the node m7. Accordingly, a voltage level of the node m7, a voltage level of the node m8, and a voltage level of the node m9 may be maintained at a previous voltage level, respectively.

Because both the voltage level of the node m4 and the voltage level of the node m9 are the second level Lv2, the fixing circuit 240 may output a voltage level of the node q0 having the first level Lv1 when outputting a voltage level of the node q1 having the second level Lv2. Alternatively, the fixing circuit 240 may output a voltage level of the node q0 having the second level Lv2 when outputting a voltage level of the node q1 having the first level Lv1.

In a time period 't1' to 't2', the inner clock signal im1 of the second level Lv2 and the inner clock signal im2 of the first level Lv1 may be received.

Because the inner clock signal im1 of the second level Lv2 is applied to the first switching circuit 220, the first switching circuit 220 may electrically disconnect the node m1 from the node m2. Accordingly, a voltage level of the node m2 may be changed by the fifth adjusting current that is output from the transistor 232.

At the time when the node m1 is electrically disconnected from the node m2, because the voltage level of the node m3 is the second level Lv2 and the voltage level of the inner clock signal im1 is the second level Lv2, the logic gate 234 may adjust a voltage level of the node m4 to the first level Lv1.

Because the voltage level of the node m4 and the voltage level of the inverted inner clock signal /im1 are the first level Lv1, the transistors 231 and 232 may output the fifth adjusting current to the node m2. Accordingly, a voltage level of the node m2 may increase to the second level Lv2. As the voltage of the node m2 increases, a voltage level of the node m3 may decrease to the first level Lv1.

Because the voltage level of the node m2 reaches the second level Lv2, the logic gate 234 may adjust a voltage level of the node m4 to the second level Lv2.

Because the inner clock signal im2 of the first level Lv1 is applied in the time period 't1' to 't2', the components 250, 260, and 271 to 274 may operate the same as the components 210, 220, and 231 to 234 as described with reference to the time period 't0' to 't1'. Accordingly, a voltage level of the node m9 may be maintained at the second level Lv2.

Because the voltage level of the node m4 is the first level Lv1 and the voltage level of the node m9 is the second level Lv2, the fixing circuit 240 may output a voltage level of the node q0 having the second level Lv2.

In a time period 't2' to 't3', the inner clock signal im1 of the second level Lv2 and the inner clock signal im2 of the first level Lv1 may be received.

Because the inner clock signal im1 of the second level Lv2 is continuously applied in the time period 't2' to 't3', the components 210, 220, and 231 to 234 may maintain the operation at the time 't2'. Accordingly, a voltage level of the node m4 may be maintained at the second level Lv2.

Because the inner clock signal im2 of the first level Lv1 is continuously applied in the time period 't1' to 't2', the components 250, 260, and 271 to 274 may operate as described with reference to the time period 't1' to 't2'. Accordingly, a voltage level of the node m9 may be maintained at the second level Lv2.

Because the voltage level of the node m4 is the second level Lv2 and the voltage level of the node m9 is the second level Lv2, the fixing circuit 240 may output a voltage level of the node q0 having the second level Lv2.

In a time period 't3' to 't4', the inner clock signal im1 of the second level Lv2 and the inner clock signal im2 of the first level Lv1 may be received.

Because the inner clock signal im1 of the second level Lv2 is continuously applied in the time period 't3' to 't4', the components 210, 220, and 231 to 234 may maintain the operations at the time 't2'. Accordingly, a voltage level of the node m4 may be maintained at the second level Lv2.

Because the inner clock signal im2 of the first level Lv1 is received in the time period 't3' to 't4', the components 250, 260, and 271 to 274 may maintain the operations at the time 't2'. Accordingly, a voltage level of the node m9 may be maintained at the second level Lv2.

Because the voltage level of the node m4 is the second level Lv2 and the voltage level of the node m9 is the second level Lv2, the fixing circuit 240 may output a voltage level of the node q0 having the second level Lv2.

In a time period 't4' to 't5', the inner clock signal im1 of the first level Lv1 and the inner clock signal im2 of the second level Lv2 may be received.

Because the inner clock signal im1 of the first level Lv1 is applied in the time period 't4' to 't5', the components 210, 220, and 231 to 234 may operate the same as the operations in the time period 't0' to 't1'. Accordingly, a voltage level of the node m4 may be maintained at the second level Lv2.

Because the inner clock signal im2 of the second level Lv2 is received in the time period 't3' to 't4', the components 250, 260, and 271 to 274 may operate the same as the operations of the components 210, 220, and 231 to 234 in the time period 't1' to 't2'. Accordingly, a voltage level of the node m9 may be the first level Lv1.

Because the voltage level of the node m4 is the second level Lv2 and the voltage level of the node m9 is the first level Lv1, the fixing circuit 240 may output a voltage level of the node q0 having the first level Lv1.

For example, the compensating circuit 100a may adjust voltage levels of the nodes m4 and m9 based on voltage levels of the nodes m4 and m9 fed back as described above.

Figure 15:
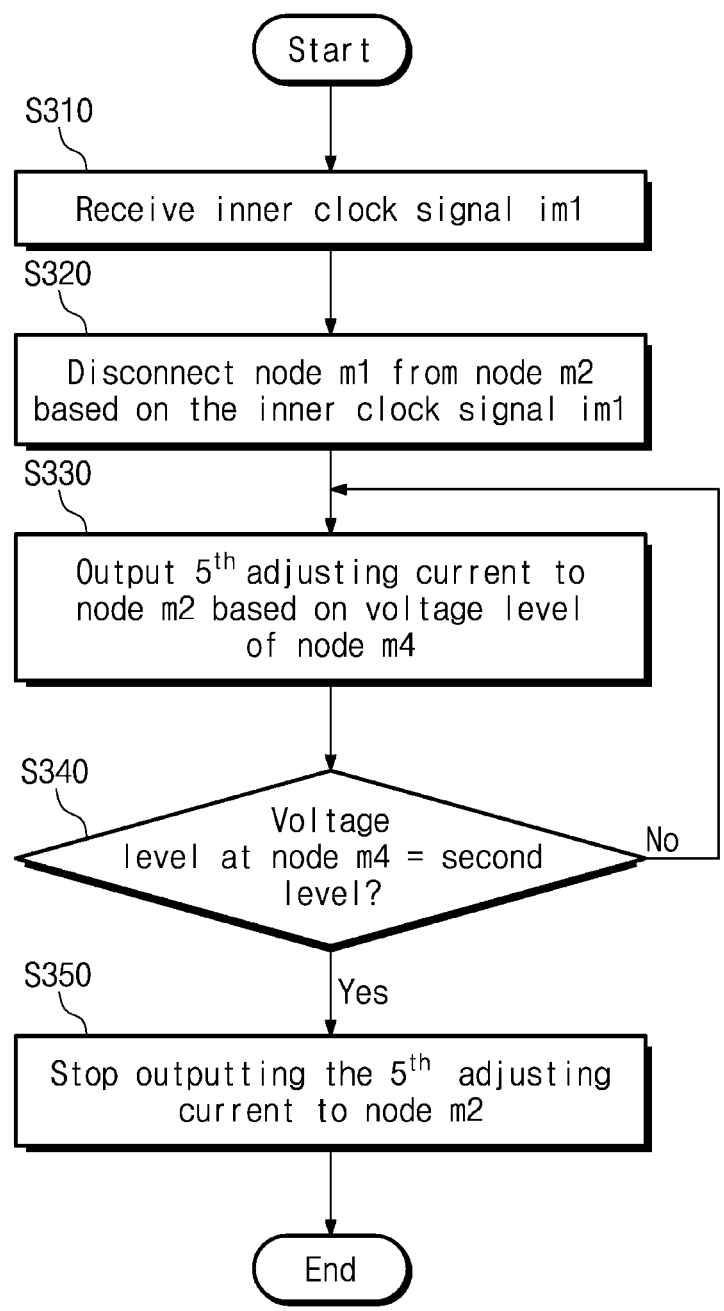
FIG. 15 is a flowchart for describing an operation of a compensating circuit of FIG. 13 according to example embodiments.

FIG. 15 is a flowchart for describing an operation of a compensating circuit of FIG. 13 according to example embodiments.

An operation of the compensating circuit 100a of FIG. 13 in the time period 't1' to 't2' of FIG. 14 will be described with reference to FIG. 15. Operations of the components 220 and 231 to 235 will be mainly described with reference to FIG. 15. Operations to be described with reference to FIG. 15 may correspond to the operations of the components 220 and 231 to 235 in the time period 't3' to 't4'.

In operation S310, the compensating circuit 100a may receive the inner clock signal im1 of the second level Lv2.

In operation S320, the first switching circuit 220 may electrically disconnect the node m1 from the node m2 when the inner clock signal im1 of the second level Lv2 is received. In this case, a voltage level of the node m2 may be irrelevant to a voltage level of the node m1.

Because a voltage level of the node m4 is the first level Lv1, in operation S330, the transistor 232 may output the fifth adjusting current to the node m2.

In operation S340, the transistor 232 may determine whether to output the fifth adjusting current to the node m2, depending on whether the voltage level of the node m4 is the second level Lv2.

When the voltage level of the node m4 does not reach the second level Lv2, operation S330 may be again performed.

When a voltage level of the node m4 reaches the second level Lv2, operation S350 may be performed. In operation S350, the transistor 232 may stop outputting the fifth adjusting current to the node m2.

A compensating circuit of according to an embodiment of the inventive concept may prevent a duty ratio of the data strobe signal DQS from sharply changing or a pulse fail from occurring, due to the PVT variation. Accordingly, a memory device of the inventive concept may output the data signal DQ to a memory controller without a delay. For example, the reliability of input/output data of the memory device may be maintained.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A clock compensating circuit comprising:
 a first switching circuit configured to determine whether to electrically connect a first node to a second node, based on a first clock signal;
 a first pulse adjusting circuit connected to a first output node and configured to:
  output a first adjusting current based on a voltage level of the first output node when the second node is electrically disconnected from the first node, and
  block the first adjusting current in response to the first clock signal;
 a second switching circuit configured to determine whether to electrically connect a third node to a fourth node, based on a second clock signal different from the first clock signal; and
 a second pulse adjusting circuit connected to a second output node and configured to:
  output a second adjusting current based on a voltage level of the second output node when the fourth node is electrically disconnected from the third node, and
  block the second adjusting current in response to the second clock signal,
 wherein the first pulse adjusting circuit and the second pulse adjusting circuit are respectively configured to feed back a voltage of the first output node and a voltage of the second output node to adjust a voltage level of the second node and a voltage level of the fourth node.

2. The clock compensating circuit of claim 1, further comprising:
 a latch circuit connected to the first output node and the second output node and configured to output an output signal based on the voltage level of the first output node and the voltage level of the second output node,
 wherein the clock compensating circuit is configured to generate a compensated clock signal based on the output signal output from the latch circuit.

3. The clock compensating circuit of claim 1,
 wherein the first switching circuit includes a transmission gate placed between the first node and the second node, and
 wherein the second switching circuit includes a transmission gate placed between the third node and the fourth node.

4. The clock compensating circuit of claim 1,
 wherein the first switching circuit:
  electrically disconnects the first node from the second node when a voltage level of the first clock signal is a first level, and
  electrically connects the first node to the second node when the voltage level of the first clock signal is a second level, and
 wherein the first level is different from the second level.

5. The clock compensating circuit of claim 1,
 wherein the first pulse adjusting circuit includes first and second transistors,
 wherein the first and second transistors:
  output a third adjusting current to the first output node when the second node is electrically disconnected from the first node and the voltage level of the second node is a first level, and
  block the third adjusting current when the voltage level of the second node is a second level lower than the first level, and
 wherein the first pulse adjusting circuit adjusts the voltage level of the second node to the second level when the voltage level of the first output node reaches the first level.

6. The clock compensating circuit of claim 5,
 wherein the first pulse adjusting circuit further includes a latch circuit placed between the second node and a fifth node,
 wherein the first transistor is a PMOS transistor placed between a power supply terminal and the second transistor and receiving the first clock signal, and
 wherein the second transistor is a PMOS transistor placed between the first transistor and the first output node and receiving a voltage signal from the fifth node.

7. The clock compensating circuit of claim 5,
 wherein the first pulse adjusting circuit further includes third and fourth transistors, and
 wherein the third and fourth transistors:
  output the first adjusting current from the second node to a ground terminal when the second node is electrically disconnected from the first node and the voltage level of the first output node is the first level, and
  block the first adjusting current when the voltage level of the first output node is the second level.

8. The clock compensating circuit of claim 7,
 wherein the third transistor is an NMOS transistor placed between the second node and the fourth transistor and receiving a voltage signal from the first output node, and
 wherein the fourth transistor is an NMOS transistor placed between the fourth transistor and the ground terminal and receiving an inverted first clock signal.

9. The clock compensating circuit of claim 1,
 wherein the second pulse adjusting circuit includes first and second transistors,
 wherein the first and second transistors:
  output a third adjusting current from the second output node to a ground terminal when the fourth node is electrically disconnected from the third node and the voltage level of the fourth node is a second level, and
  block the third adjusting current when the voltage level of the fourth node is a first level higher than the second level, wherein the second pulse adjusting circuit adjusts the voltage level of the fourth node to the first level when the voltage level of the second output node reaches the second level, and wherein the first output node and the second output node are the same node.

10. The clock compensating circuit of claim 9, wherein the second pulse adjusting circuit further includes a latch circuit placed between the fourth node and a sixth node, wherein the first transistor is an NMOS transistor placed between the second output node and the second transistor and receiving a voltage signal from the sixth node, and wherein the second transistor is an NMOS transistor placed between the first transistor and the ground terminal and receiving the second clock signal.

11. The clock compensating circuit of claim 10, wherein the second pulse adjusting circuit further includes third and fourth transistors, and wherein the third and fourth transistors:

output the second adjusting current to the fourth node when the fourth node is electrically disconnected from the third node and the voltage level of the second output node is the second level, and block the second adjusting current when the voltage level of the second output node is the first level.

12. The clock compensating circuit of claim 11, wherein the third transistor is a PMOS transistor placed between a power supply terminal and the fourth transistor and receiving an inverted second clock signal, and wherein the fourth transistor is a PMOS transistor placed between the third transistor and the fourth node and receiving a voltage from the second output node.

13. A memory device comprising:

a delay locked loop (DLL) configured to output a first clock signal and a second clock signal different from the first clock signal;

a clock compensating circuit connected to an output node and configured to:

adjust a voltage level of the output node based on the first clock signal and the second clock signal, generate an inner clock signal based on the voltage level of the output node; and a data input/output (I/O) circuit configured to output data to an outside of the memory device based on the inner clock signal, wherein the clock compensating circuit includes:

a first pulse adjusting circuit connected to a first output node and configured to determine whether to output a first adjusting current based on the first clock signal and a voltage level of the first output node, and a second pulse adjusting circuit connected to a second output node and configured to determine whether to output a second adjusting current based on the second clock signal and a voltage level of the second output node.

14. The memory device of claim 13, wherein, based on the first clock signal, the first pulse adjusting circuit outputs the first adjusting current from the first node to a ground terminal when the voltage level of the first output node is a first level and blocks the first adjusting current in response to the first clock signal, wherein, based on the second clock signal, the second pulse adjusting circuit outputs the second adjusting current from a power supply terminal to the second node when the voltage level of the second output node is a second level different from the first level and blocks the second adjusting current in response to the second clock signal, and wherein the first output node and the second output node are the same node.

15. The memory device of claim 13, wherein, based on the first clock signal, the first pulse adjusting circuit outputs the first adjusting current from a power supply terminal to the first node when the voltage level of the first output node is a second level and blocks the first adjusting current in response to the first clock signal, wherein, based on the second clock signal, the second pulse adjusting circuit outputs the second adjusting current when the voltage level of the second output node is the second level and blocks the second adjusting current in response to the second clock signal, and wherein the first output node is different from the second output node.

16. A clock compensating circuit comprising:

a first switching circuit configured to determine whether to electrically connect a first node to a second node, based on a first clock signal;

a first pulse adjusting circuit configured to:

output a first adjusting current based on a voltage level of the first clock signal and a voltage level of the second node to adjust a voltage level of a first output node, and feed back a voltage of the first output node to adjust the voltage level of the second node when the first node is electrically disconnected from the second node;

a second switching circuit configured to determine whether to electrically connect a third node to a fourth node, based on a second clock signal different from the first clock signal; and a second pulse adjusting circuit configured to:

output a second adjusting current based on a voltage level of the second clock signal and a voltage level of the fourth node to adjust a voltage level of a second output node, and feed back a voltage of the second output node to adjust the voltage level of the fourth node when the third node is electrically disconnected from the fourth node.

17. The clock compensating circuit of claim 16, further comprising:

a latch circuit connected to the first output node and the second output node and configured to output an output signal based on the voltage level of the first output node and the voltage level of the second output node, wherein the clock compensating circuit is configured to generate a compensated clock signal for transmitting data to an external device, based on the output signal output from the latch circuit.

18. The clock compensating circuit of claim 17, wherein the first pulse adjusting circuit includes:

a logic gate configured to perform a logical operation on the voltage level of the first clock signal and the voltage level of the second node; and a transistor configured to output the first adjusting current to the second node, depending on the voltage level of the first output node.

19. The clock compensating circuit of claim 18, wherein the logic gate is a NAND gate placed between the second node and the first output node.

20. The clock compensating circuit of claim 18, wherein the transistor is a PMOS transistor placed between a power supply terminal and the second node and receiving a voltage signal from the first output node.

\* \* \* \* \*